United States Patent [19]

Welch et al.

[11] Patent Number: 5,861,827
[45] Date of Patent: Jan. 19, 1999

[54] DATA COMPRESSION AND DECOMPRESSION SYSTEM WITH IMMEDIATE DICTIONARY UPDATING INTERLEAVED WITH STRING SEARCH

[75] Inventors: Terry A. Welch, deceased, late of Austin, Tex., by Theresa Raylene Welch, executrix; Albert B. Cooper, New York, N.Y.

[73] Assignee: Unisys Corporation, Blue Bell, Pa.

[21] Appl. No.: 753,871

[22] Filed: Dec. 3, 1996

Related U.S. Application Data

[60] Provisional application No. 60/023,094 JUL. 24, 1996.
[51] Int. Cl.$^6$ ..................................................... H03M 7/30
[52] U.S. Cl. ................................................................ 341/51
[58] Field of Search ................................................ 341/51

[56] References Cited

U.S. PATENT DOCUMENTS

| | | | |
|---|---|---|---|
| 4,558,302 | 12/1985 | Welch | 341/51 |
| 4,814,746 | 3/1989 | Miller et al. | 341/95 |
| 4,876,541 | 10/1989 | Storer | 341/51 |
| 5,153,591 | 10/1992 | Clark | 341/51 |
| 5,253,325 | 10/1993 | Clark | 395/2 |
| 5,389,922 | 2/1995 | Seroussi et al. | 341/51 |

FOREIGN PATENT DOCUMENTS 2 277 179  10/1994  United Kingdom ............ H03M 7/30

OTHER PUBLICATIONS

Nakano et al., "Highly Efficient Universal Coding with Classifying to Subdictionaries for Text Compression", Sep. 1994, IEICE Transactions on Fundamentals of Electronics, Communications, and Computer Sciences, Vol. E77–A, No. 9, Tokyo, JP.

*Primary Examiner*—Howard L. Williams
*Attorney, Agent, or Firm*—Albert B. Cooper; Mark T. Starr

[57] ABSTRACT

A dictionary based data compression and decompression system where, in the compressor, when a partial string W and a character C are matched in the dictionary, a new string is entered into the dictionary with C as an extension character on the string PW where P is the string corresponding to the last output compressed code signal. An update string is entered into the compression dictionary for each input character that is read and matched. The updating is immediate and interleaved with the character-by-character matching of the current string. The update process continues until the longest match is found in the dictionary. The code of the longest matched string is output in a string matching cycle. If a single character or multi-character string "A" exists in the dictionary, the string AAA . . . A is encoded in two compressed code signals regardless of the string length. This encoding results in an unrecognized code signal at the decompressor. The decompressor, in response to an unrecognized code signal, enters update strings into the decompressor dictionary in accordance with the recovered string corresponding to the previously received code signal, the unrecognized code signal, the extant code of the decompressor and the number of characters in the previously recovered string.

50 Claims, 16 Drawing Sheets

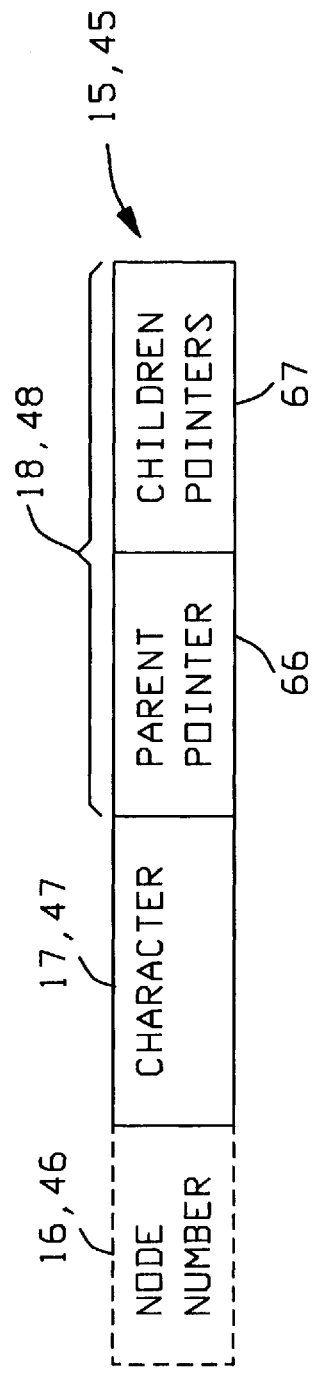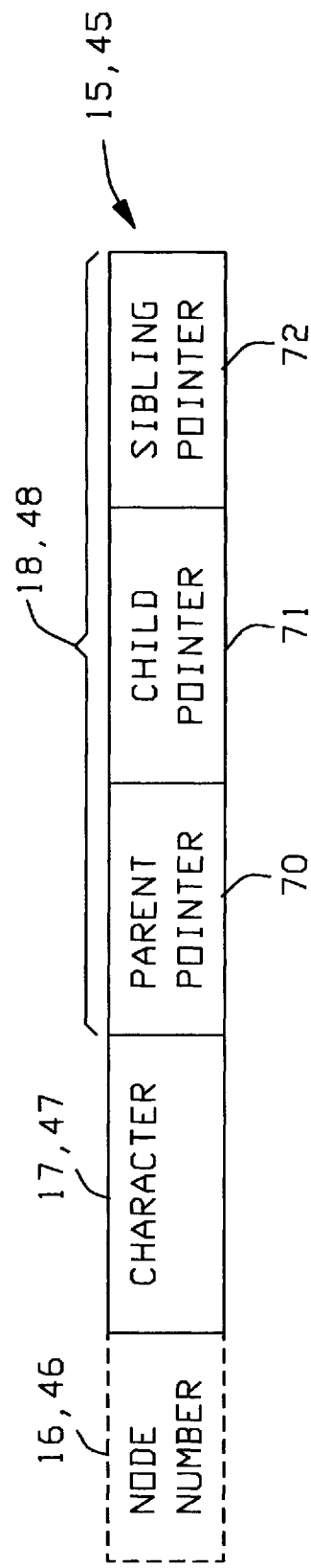
FIG. 3a
FIG. 3b

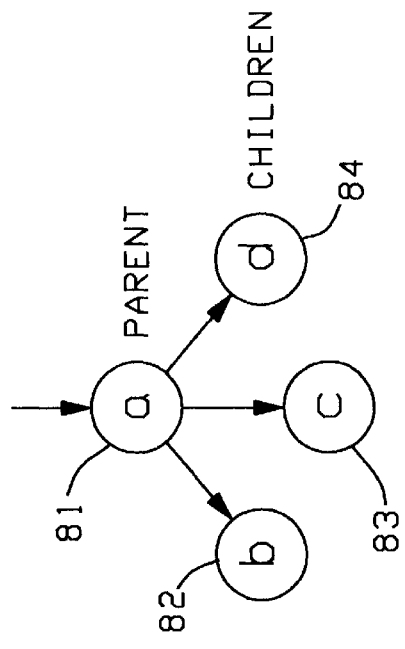
FIG. 4a
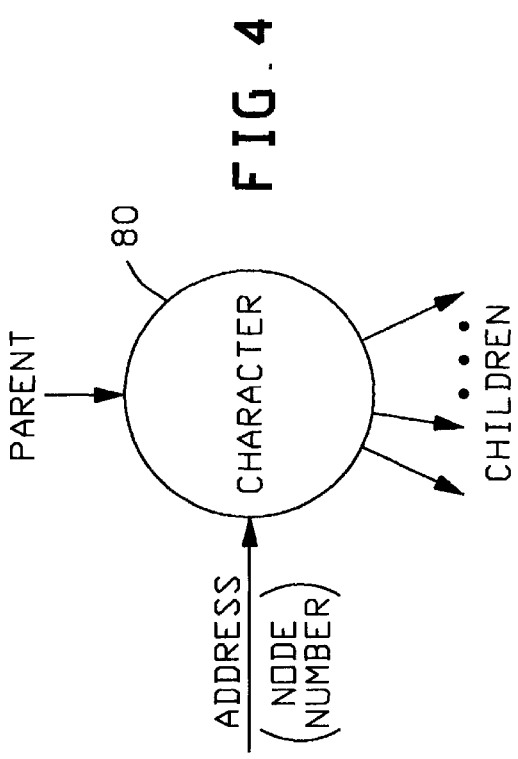
FIG. 4
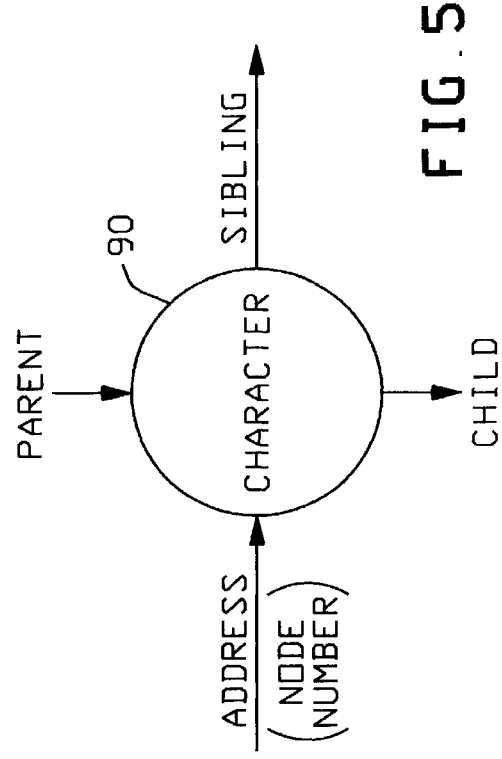
FIG. 5a
FIG. 5

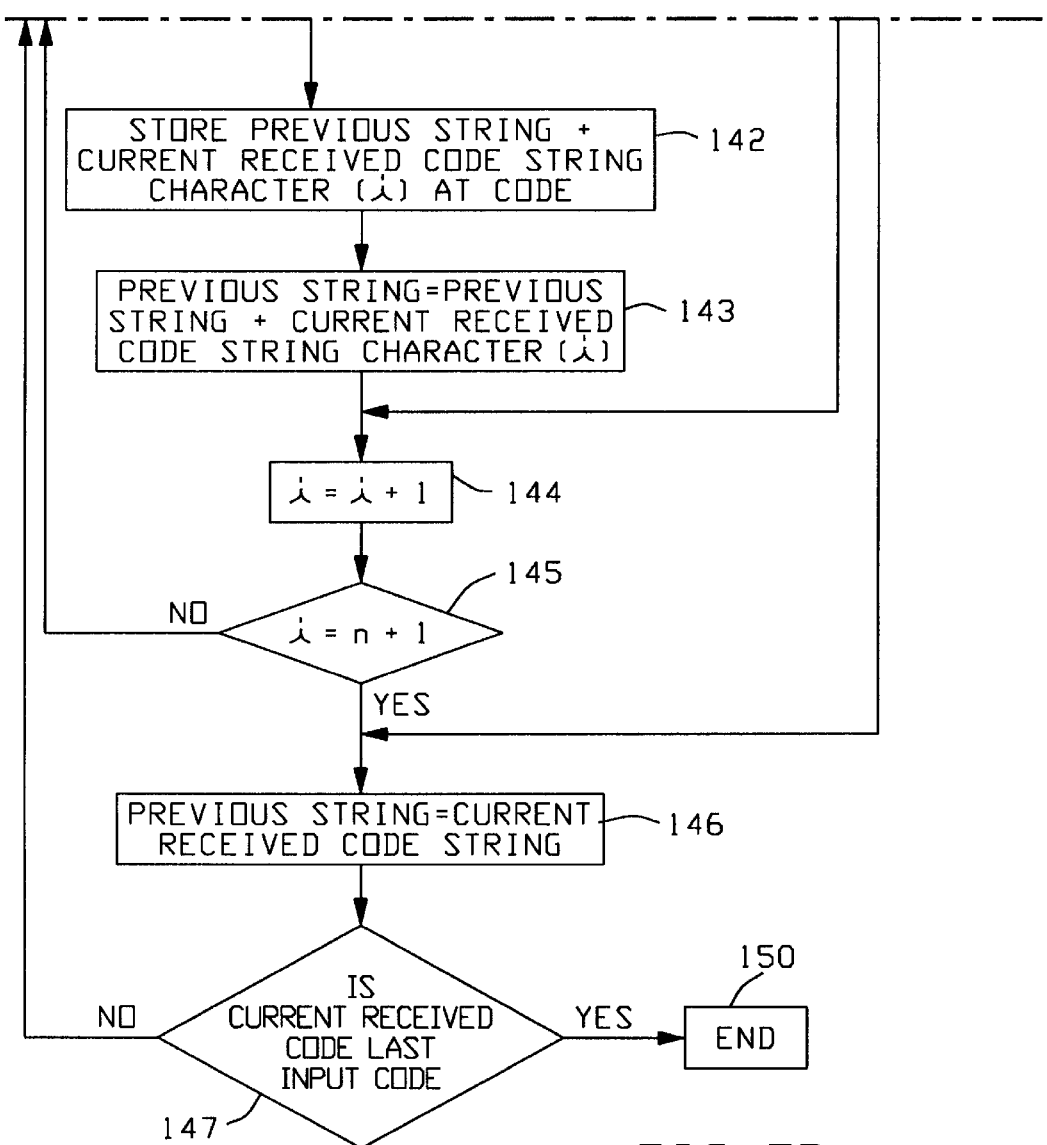
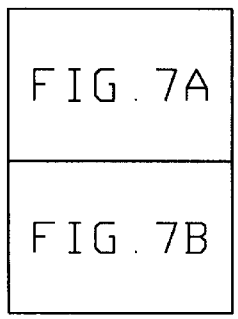
FIG. 7B
FIG. 7

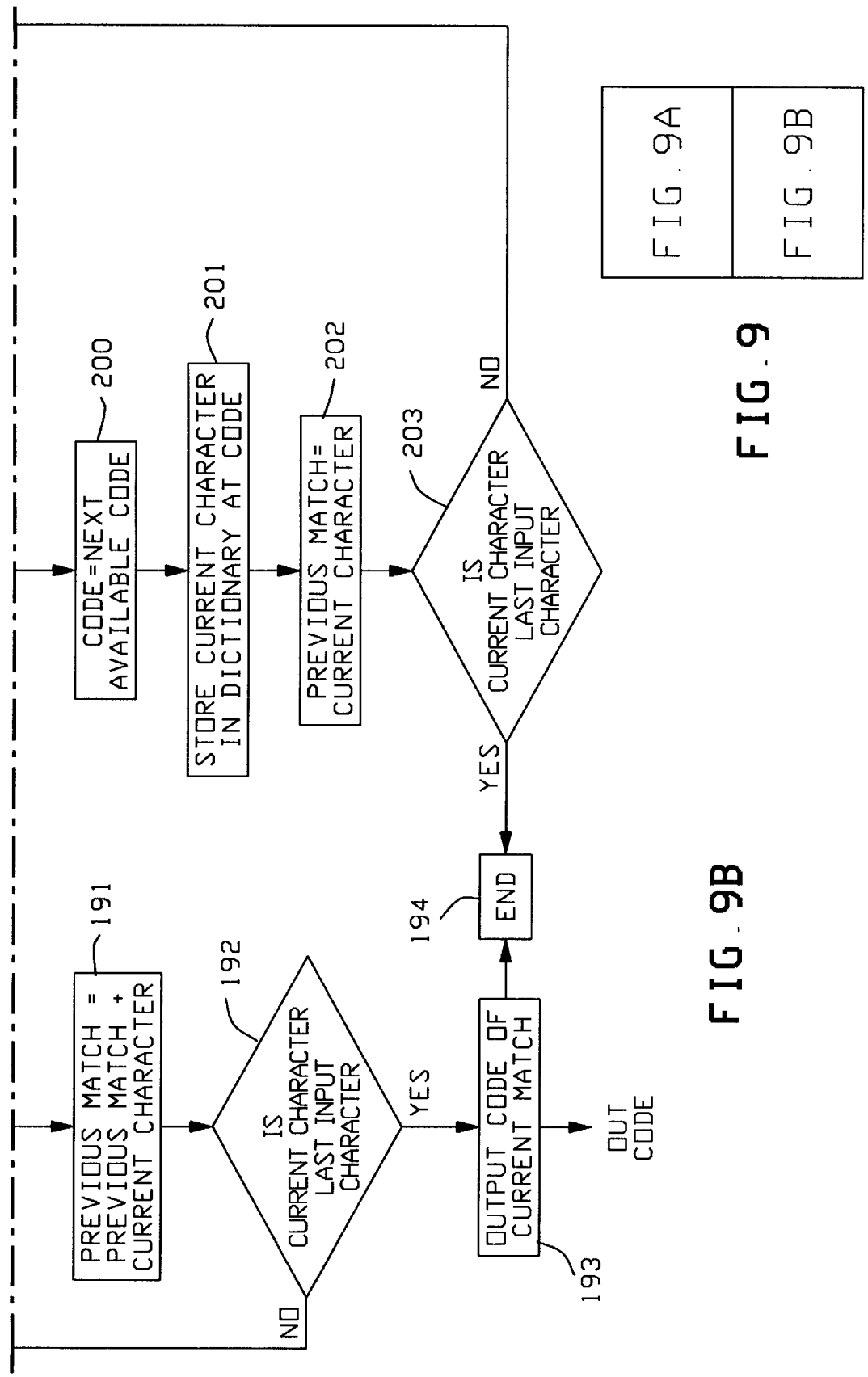

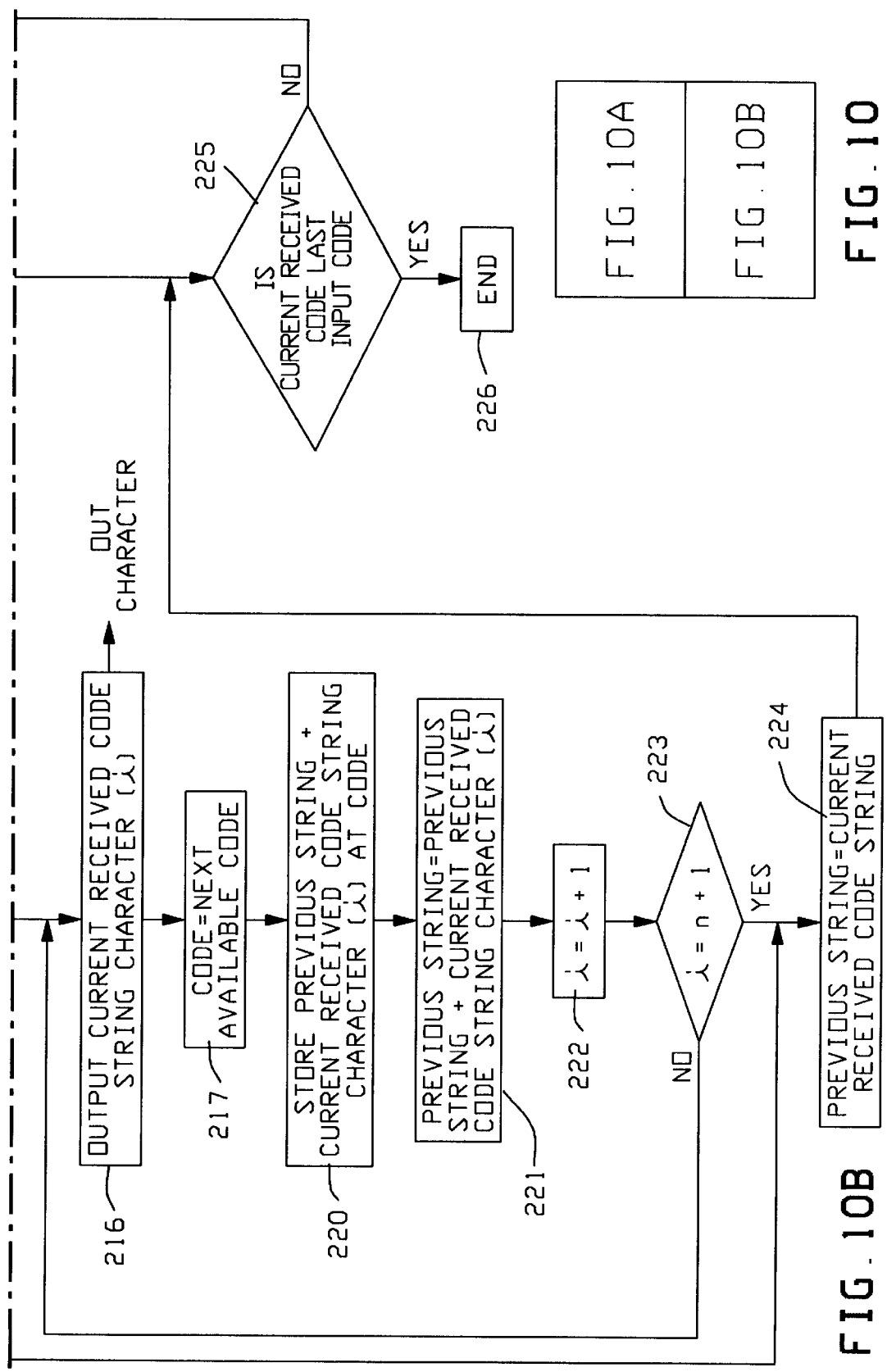

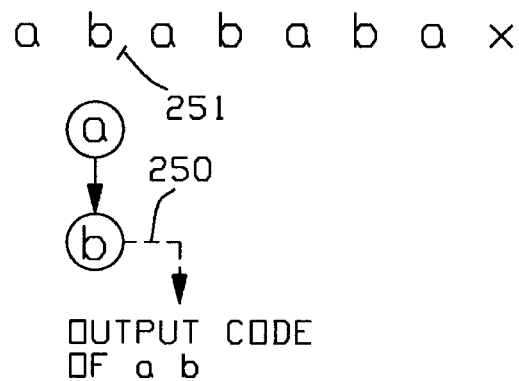
FIG. 12a
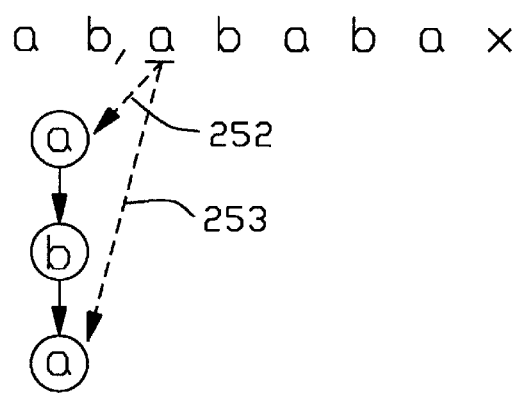
FIG. 12b
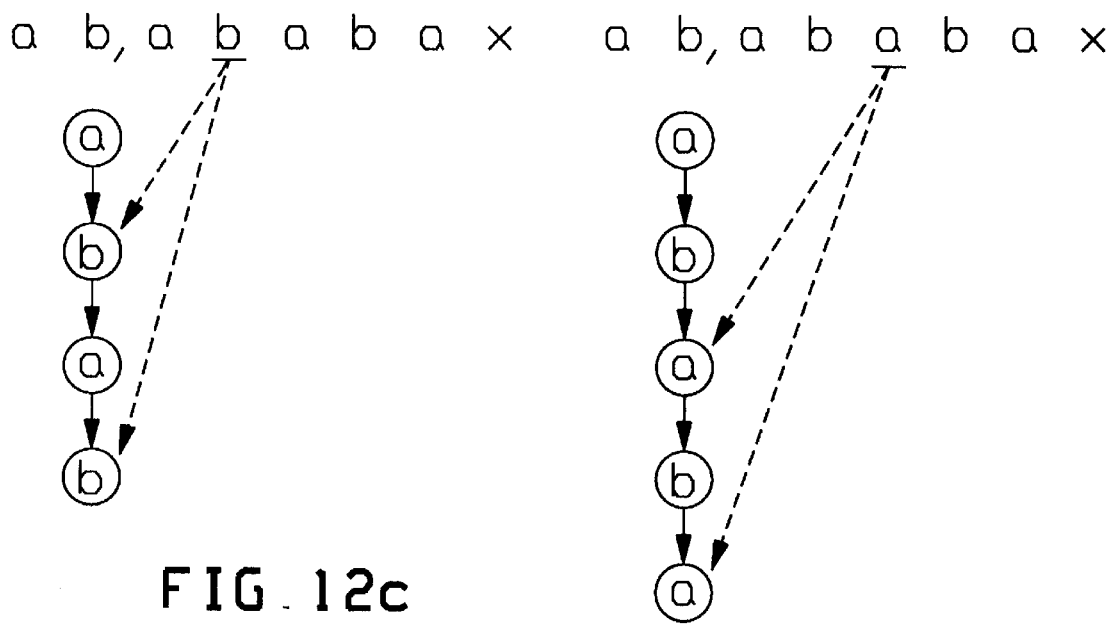
FIG. 12c
FIG. 12d

DATA COMPRESSION AND DECOMPRESSION SYSTEM WITH IMMEDIATE DICTIONARY UPDATING INTERLEAVED WITH STRING SEARCH

CROSS REFERENCE TO RELATED APPLICATIONS

This is a nonprovisional application corresponding to and claiming the benefit of copending provisional application Ser No. 60/023,094, filed on Jul. 24, 1996.

BACKGROUND OF THE INVENTION

1. Field of the Invention

The invention relates to dictionary based data compression and decompression particularly with respect to the manner in which the compression and decompression dictionaries are updated.

2. Description of the Prior Art

The Lempel-Ziv (LZ) algorithm known as LZ2 provides the theoretical basis for numerous dictionary based data compression and decompression systems in widespread usage. LZ2 is described in a paper entitled "Compression Of Individual Sequences Via Variable-Rate Coding" by Jacob Ziv and Abraham Lempel, published in the IEEE Transactions on Information Theory, Vol. IT-24, No. 5, September 1978, pages 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has also been adopted as the compression and decompression methods used in the GIF and TIFF image communication standards. A variant of LZ2 is described in U.S. Pat. No. 4,876,541 by Storer, issued Oct. 24, 1989. Further examples of LZ dictionary based compression and decompression systems are described in U.S. Pat. No. 4,464,650 by Eastman et al., issued Aug. 7, 1984; U.S. Pat. No. 4,814,746 by Miller et al., issued Mar. 21, 1989; U.S. Pat. No. 5,153,591 by Clark, issued Oct. 6, 1992; and European Patent Application Publication Number 0 573 208 A1 by Lempel et al., published Dec. 8, 1993.

In the above-cited systems, the input data character stream is compared character-by-character with character strings stored in a dictionary to effect a match therewith. Typically, the character-by-character comparison is continued until the longest match is determined. Based on the match, a compressed code is output and the dictionary is updated with one or more additional character strings. In the Storer patent ('541) the dictionary is updated by concatenating all of the non-zero prefixes of the current longest matched string with the previous longest matched string. Thus, if there are N characters in the current longest match, N strings are added to the dictionary after the current longest match is determined. In the Storer patent this is denoted as the All Prefixes (AP) update technique.

Another type of data compression and decompression method is denoted as Run-Length Encoding (RLE). The RLE algorithm compresses a repeating character or character group run by providing a compressed code indicating the character or character group and the length of the run. RLE is thus effective in encoding long runs of the same character or group of characters. For example, RLE is effective in compressing a long sequence of blanks that may be included at the beginning of a data file. RLE is also effective in image compression where an image contains a long run of consecutive pixels having the same value, such as in the sky portion of a land-sky image.

The LZ dictionary based compression and decompression algorithms discussed above are not especially effective in compressing long runs of a repeating character or character group. Even utilizing the AP update technique, a large number of compressed code outputs are required to compress a long length run.

This deficiency of the dictionary based systems is traditionally overcome by applying the data to a run length encoder and applying the run length encoded data to the LZ dictionary based system. In such an architecture a run length encoder is utilized at the front end of the dictionary based compressor and a run length decoder is utilized at the output end of the dictionary based decompressor. Such a system suffers from the disadvantages of increased equipment, expense, control overhead and processing time.

SUMMARY OF THE INVENTION

The invention is embodied in a dictionary based data compression and decompression system that overcomes the above-described deficiency. If a string A exists in the dictionary, then the string AAA...A is encoded in two compressed code symbols, regardless of its length. Thus, strings of repeated characters, such as blanks and zeros, or character groups such as consecutive image pixels with the same value, can be encoded very efficiently on the first encounter.

In the compression algorithm of the present invention a string is entered into the compression dictionary as each input character is read and matched. Conventionally, an update string or strings is entered into the dictionary when a longest match is achieved and an output compressed code symbol is determined. The operation of the algorithm is as follows. Each time a partial string W and character C are found in the dictionary, a new string is entered into the dictionary with C as an extension character on the string PW where P was the string conveyed in the last transmitted output compressed code symbol. Thus, as the string W is matched, the string P is extended by the characters of W as they are matched in the string searching process. This might be referred to as "on-the-fly" dictionary updating where the dictionary updating is immediate and interleaved character-by-character with the string searching process. Thus, as a character-by-character match of the input with the stored string W is effected, each matching character is appended to the end of the growing string PW. The update process ends when the input data characters have matched the longest string W in the dictionary.

When the string W being matched coincides with the previously matched string P, the run length encoding advantage described above is realized. When this occurs, the compressor transmits a compressed code symbol that is unrecognized at the decompressor. The decompressor uses an unrecognized code process to maintain synchronism with the compression dictionary, the process based on the currently assigned decompressor code, the unrecognized code, the previously decoded string and the number of characters in the previously decoded string.

BRIEF DESCRIPTION OF THE DRAWINGS

FIG. 3a is a diagram illustrating a representational data structure for the nodes of the searchtrees of the dictionaries of FIGS. 1 and 2.

FIG. 3b is a diagram illustrating a practical data structure for the nodes of the searchtrees of the dictionaries of FIGS. 1 and 2.

FIG. 4 is a schematic node diagram illustrating a node of the searchtrees of the dictionaries of FIGS. 1 and 2 in accordance with the data structure of FIG. 3a.

FIG. 4a is a schematic representation of a partial searchtree illustrating data storage utilizing the node of FIG. 4.

FIG. 5 is a schematic node diagram illustrating a node of the searchtrees of the dictionaries of FIGS. 1 and 2 in accordance with the data structure of FIG. 3b.

FIG. 5a is a schematic representation of a partial searchtree utilizing the node of FIG. 5 and storing the same strings as FIG. 4a.

FIGS. 7, 7a–7b are a control flow chart illustrating the operations executed by the decompression subsystem of FIG. 2 for decompressing the compressed code generated in accordance with FIG. 6. The flow chart of FIG. 7 is predicated on a decompression dictionary initialized with all single character strings.

FIGS. 9, 9a–9b are a control flow chart similar to that of FIG. 6 but predicated on a non-initialized compression dictionary.

FIGS. 10, and 10A–10B are a control flow chart similar to that of FIG. 7 but predicated on a non-initialized decompression dictionary. The decompression flow chart of FIG. 10 decompresses the compressed code generated in accordance with FIG. 9.

FIGS. 12a–12g are schematic representations of partial searchtrees illustrating consecutive states of the compression dictionary when the input data character stream is a repeating character group.

DESCRIPTION OF THE PREFERRED EMBODIMENTS

Figure 1:
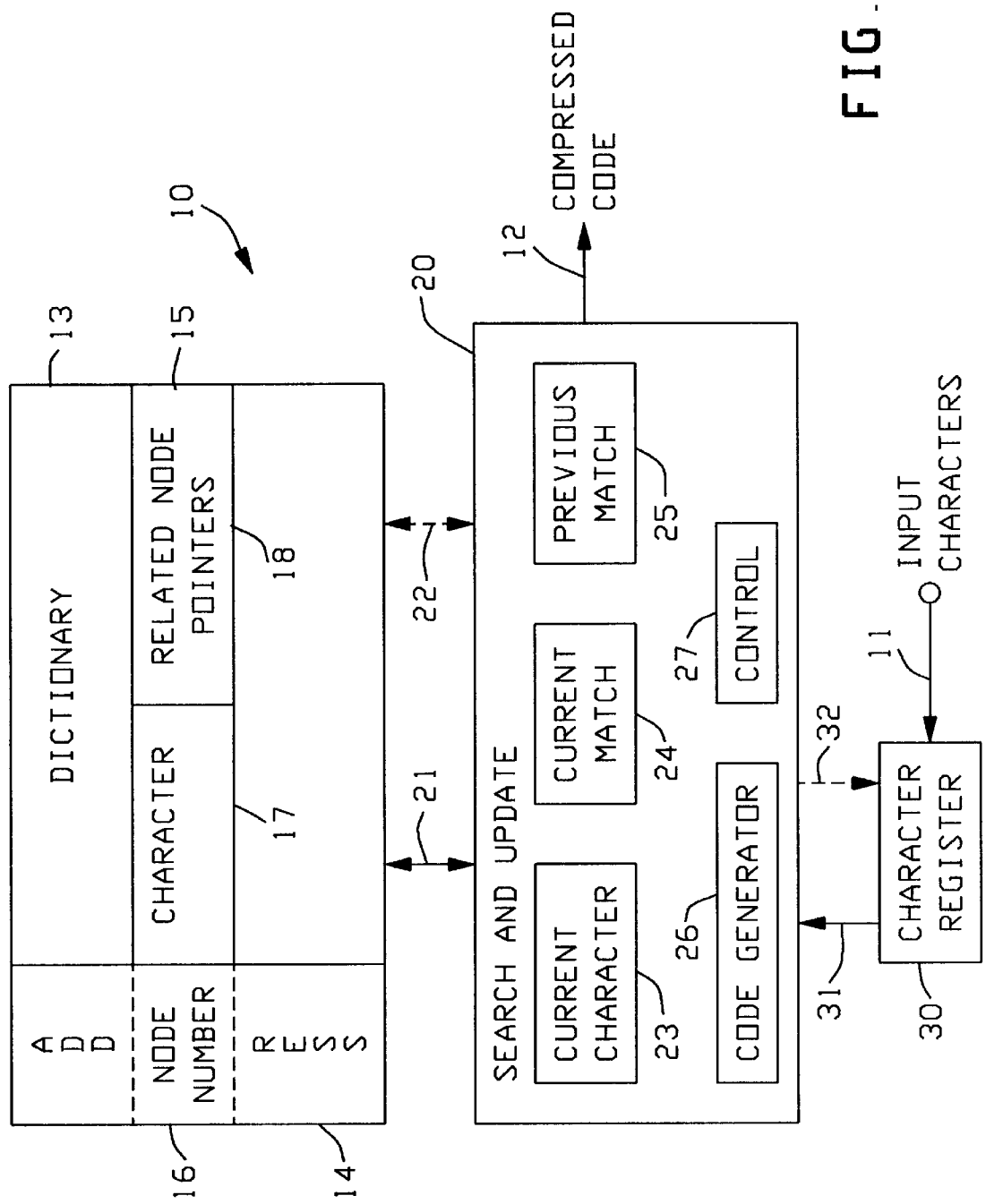
FIG. 1 is a schematic block diagram of a data compression subsystem used in embodying the present invention.

Referring to FIG. 1, a data compression subsystem 10 is illustrated that compresses a stream of input data character signals applied at an input 11 into a stream of corresponding compressed code signals at an output 12. A dictionary 13 for storing character strings is implemented by a memory such as a RAM or CAM generally in the manner described in the above-cited references. The character strings are stored in a searchtree database structure in a manner that is well understood. The searchtree is comprised of interlinked nodes stored at the locations of the dictionary 13. The memory locations of the dictionary 13 are accessed by addresses 14 in a well known manner.

The data structure of a searchtree node is illustrated by a node 15 which includes a node number 16, a character field 17 and fields 18 for related node pointers. The node number 16 identifies the tree node and the memory address 14, at which the node 15 is stored, is utilized as the node number for convenience. The character field 17 is utilized to contain the data character value of the node. Fields 18 contain pointers that link the node 15 to related tree nodes such as parent, children and sibling nodes in a well understood manner.

The compression subsystem 10 includes a search and update control section 20 coupled to the dictionary 13 via a bi-directional data bus 21 and a bi-directional control bus 22. The search and update control section 20 includes working registers denoted as a current character register 23, a current match register 24 and a previous match register 25. The search and update control section 20 further includes a code generator 26 for assigning compressed code values to character strings stored in the dictionary 13. The code generator 26 may assign code numbers sequentially or pseudorandomly such as by hashing. The assigned codes access the locations of the dictionary 13 via the memory addresses 14. Thus, as is well understood, the addresses 14 (node numbers 16) are utilized as the compressed codes for the strings stored in the dictionary 13.

Figure 6:
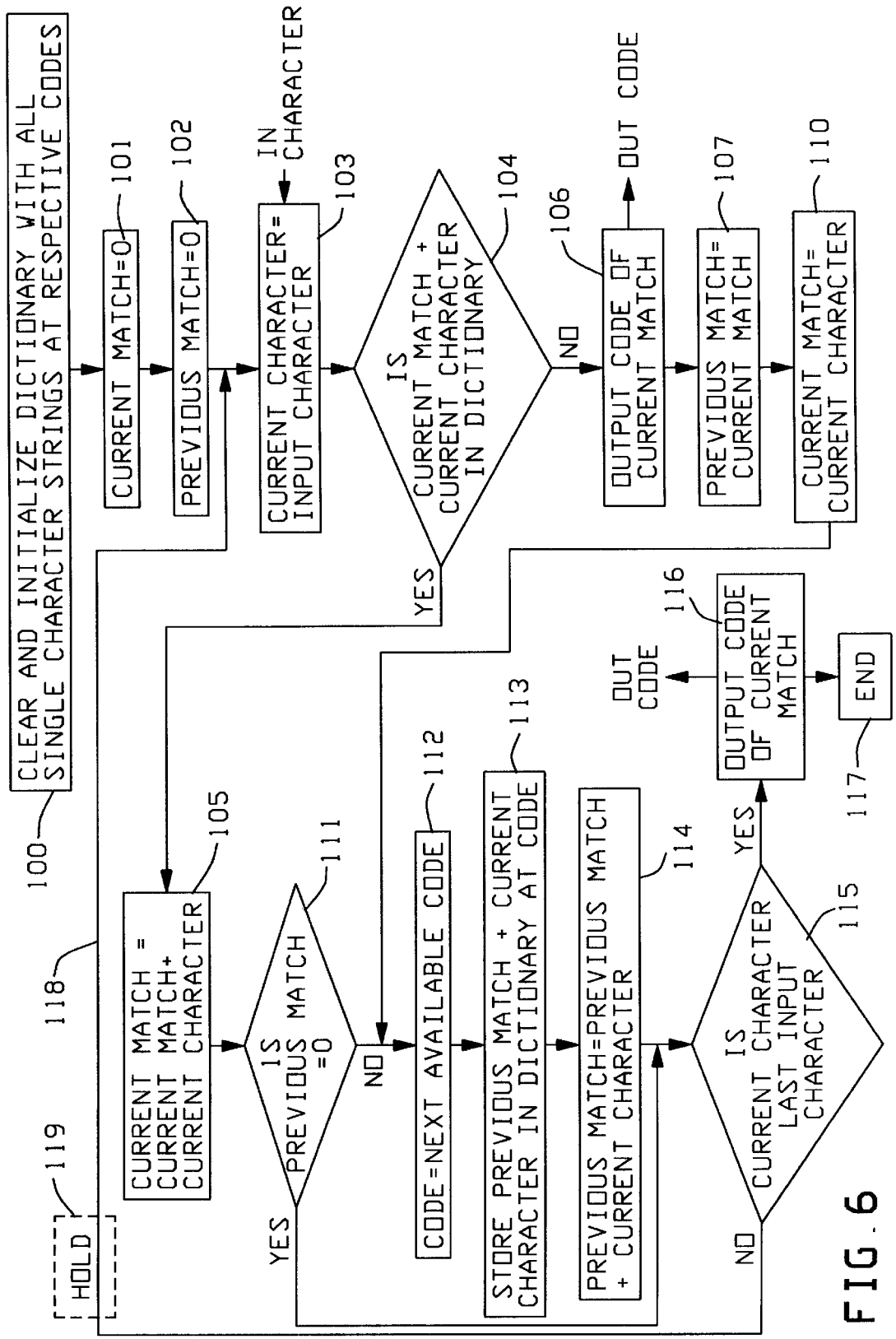
FIG. 6 is a control flow chart illustrating the operations executed by the compression subsystem of FIG. 1 so as to perform data compression in accordance with the present invention. The flow chart of FIG. 6 is predicated on a compression dictionary initialized with all single character strings.
Figure 9A:
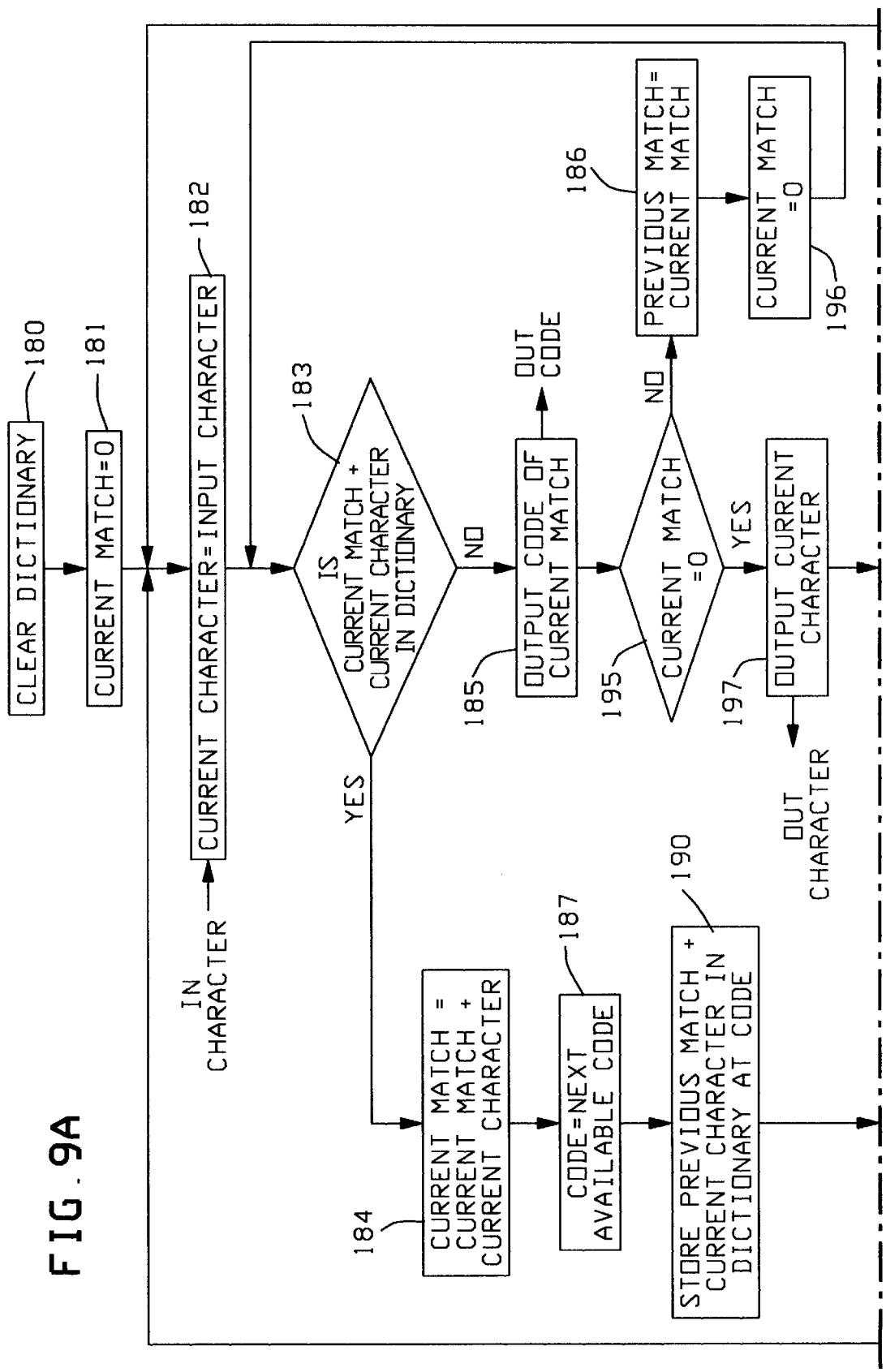

The search and update control section 20 includes control 27 for controlling the operations of the compression subsystem 10 in accordance with the operational flow charts of FIGS. 6 and 9 in a manner to be described.

The compression subsystem 10 includes a character register 30 that buffers the input data character stream received at the input 11. The individual input data characters are applied from the character register 30 via a bus 31 to the current character register 23 in accordance with operations to be described. The search and update control section 20 controls acquiring input data characters from the character register 30 via a control bus 32.

The operation of the compression subsystem 10 is briefly as follows. Input data characters are sequentially inserted into the current character register 23 and searched against the strings stored in the dictionary 13 until the longest match therewith is achieved. The current match register 24 is utilized in this process. The node number 16 of the longest matched string is provided as the compressed code at the output 12. These searching operations are the same as those described in the above-cited references. In accordance with the invention, as the input data characters match the characters of the stored dictionary string being searched, the dictionary 13 is updated by extending the string corresponding to the previous compressed output code by the current input characters as they are matched. The previous match register 25 is utilized in this process. This previous matched string, so extended, is available for matching as the input characters continue to be fetched and matched. Thus, update strings are immediately added to the dictionary 13 in an interleaved manner with respect to the character-by-character string search.

Figure 2:
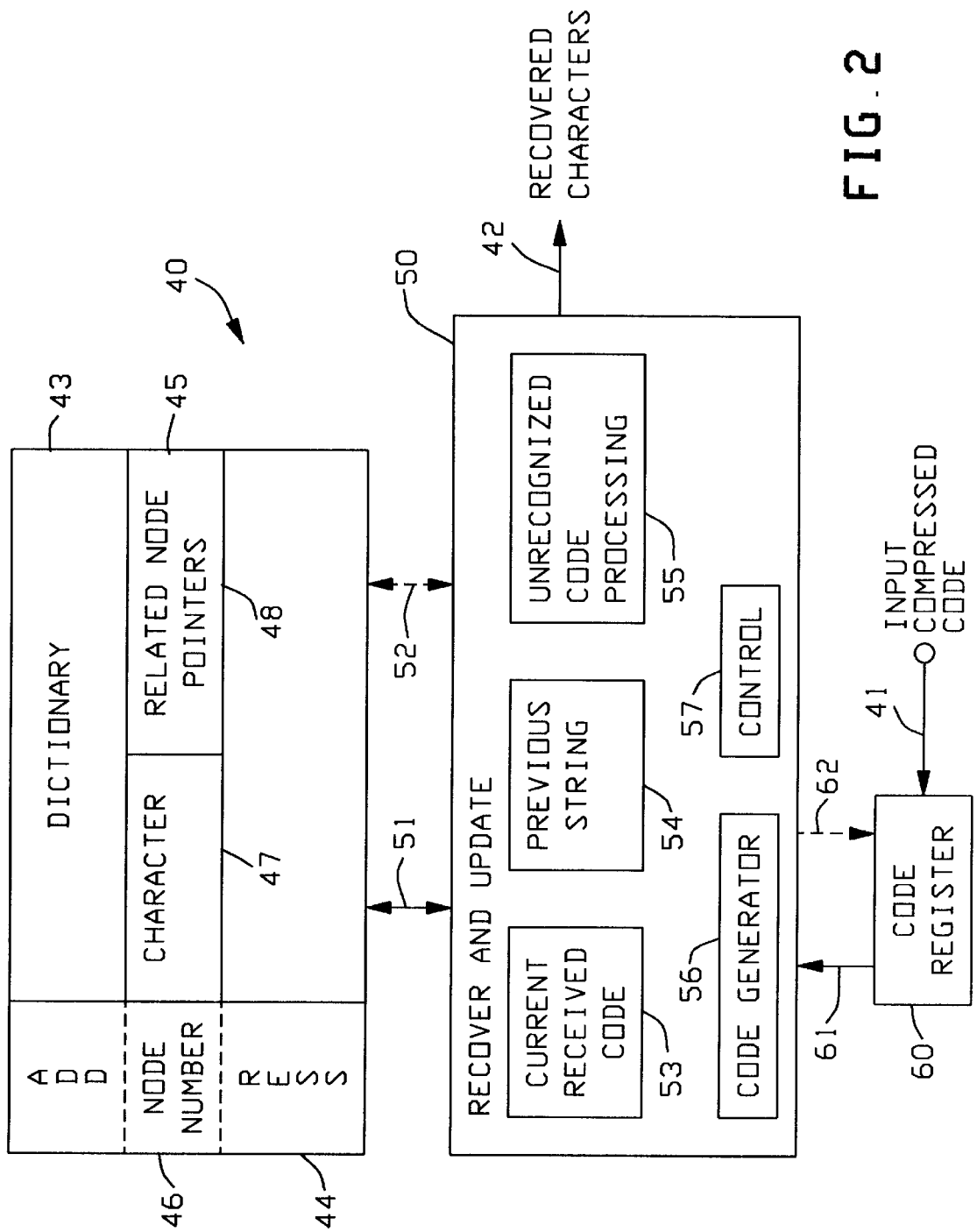
FIG. 2 is a schematic block diagram of a data decompression subsystem for recovering the compressed code output of the compressor of FIG. 1.

Referring to FIG. 2 with continued reference to FIG. 1, a decompression subsystem 40 is illustrated that recovers the characters of the original input data stream from the compressed code signals provided at the output 12 of the compression subsystem 10. Accordingly, the decompression subsystem 40 receives input compressed code signals at an input 41 and provides the corresponding recovered string characters at an output 42. The decompression subsystem 40 includes a dictionary 43 that is preferably implemented by RAM memory. The dictionary 43 is structured and updated to contain the same searchtree database as contained in the dictionary 13 of the compression subsystem 10. As each input compressed code is received at the input 41, the dictionary 43 is updated to contain the same data character strings stored in the dictionary 13. The searchtree database structure stored in the dictionary 43 is comprised of interlinked nodes stored at the locations of the dictionary 43. The memory locations of the dictionary 43 are accessed by addresses 44 in a well-known manner.

The data structure of a searchtree node is illustrated by a node 45 which, as described above with respect to the node 15 of the dictionary 13, includes a node number 46, a character field 47 and fields 48 for related node pointers. As described above with respect to the dictionary 13, the node number 46 identifies the tree node and the memory address 44, at which the node 45 is stored, is utilized as the node number. The character field 47 is utilized to contain the data character value of the node. Fields 48 contain pointers that link the node 45 to related tree nodes such as parent, children and sibling nodes as described above.

The decompression subsystem 40 includes a recover and update control section 50 coupled to the dictionary 43 via a bi-directional data bus 51 and a bi-directional control bus 52. The recover and update control section 50 includes working registers denoted as a current received code register 53 and a previous string register 54. In accordance with the invention, the recover and update control section 50 includes an unrecognized code processing section 55 to be explained in detail with respect to FIG. 8.

The recover and update control section 50 further includes a code generator 56 for assigning compressed code values to character strings stored in the dictionary 43. The code generator 56 may assign code numbers sequentially or pseudorandomly such as by hashing. For system compatibility, the code generator 56 assigns code numbers utilizing the same process and algorithm utilized by the code generator 26 of the compression subsystem 10. The assigned codes access the locations of the dictionary 43 via the memory addresses 44. Thus, as described above with respect to the compression subsystem 10, the addresses 44 (node numbers 46) are utilized as the codes for the strings stored in the dictionary 43.

Figure 7A:
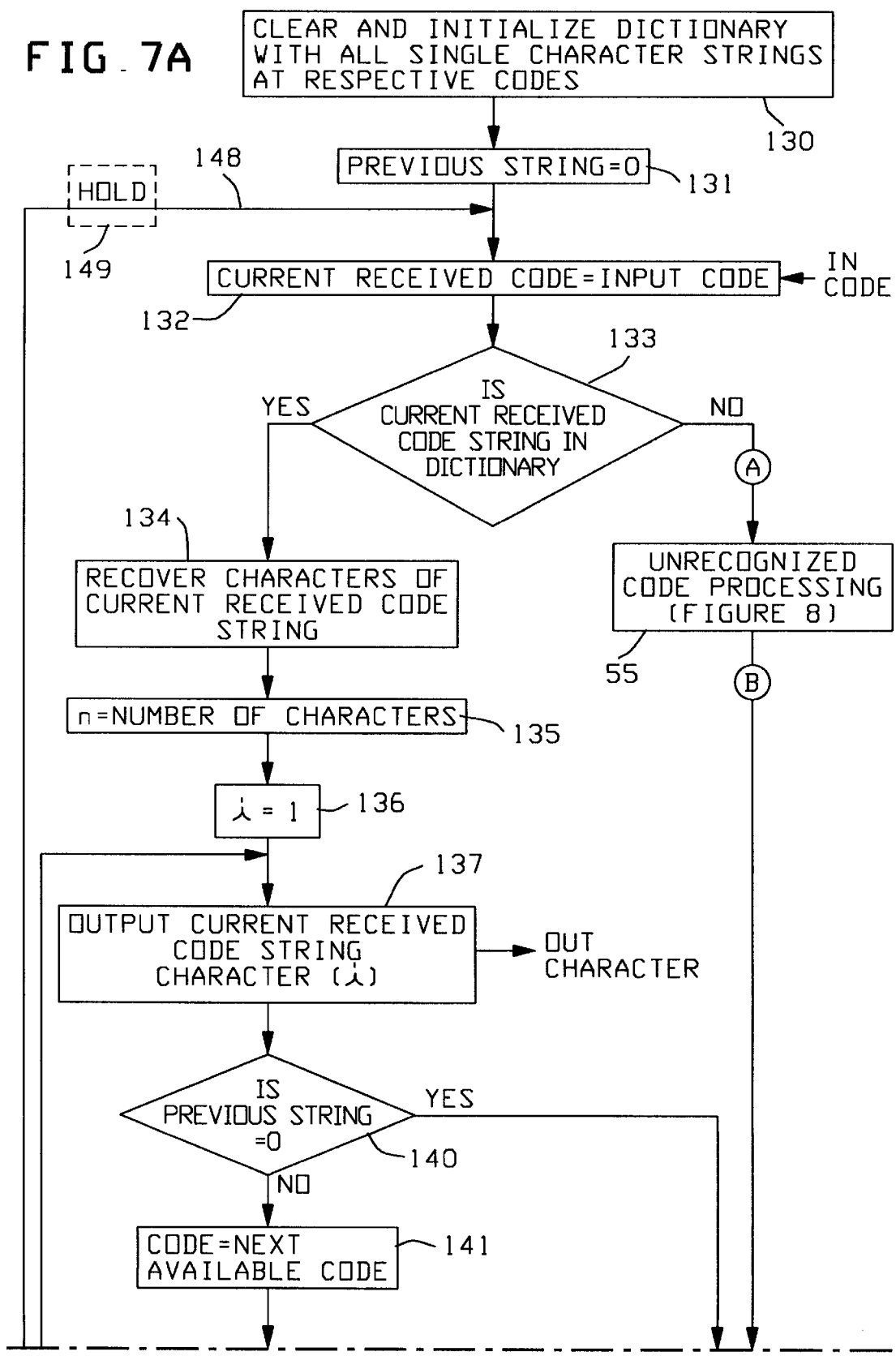
Figure 8:
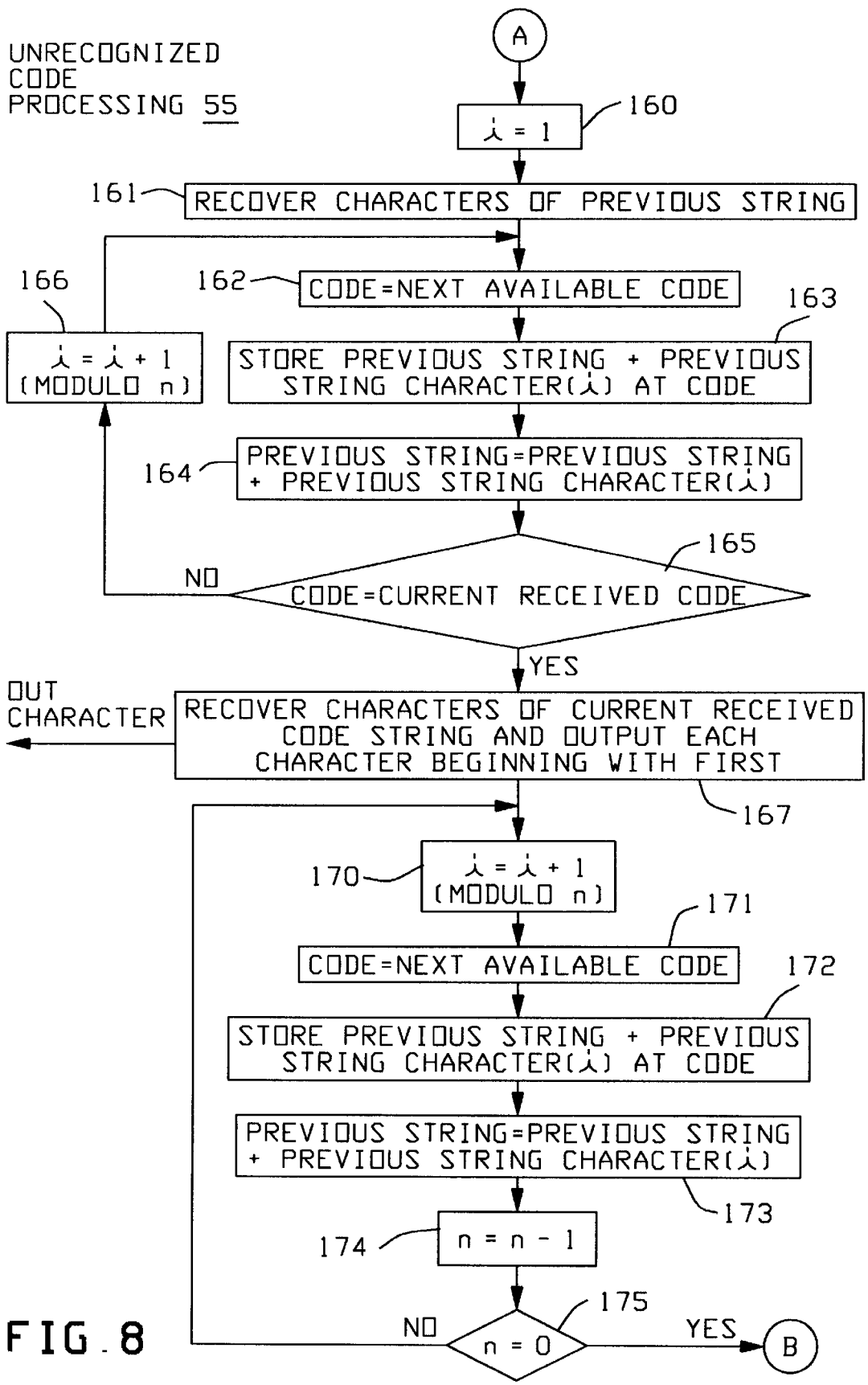
FIG. 8 is a control flow chart illustrating the unrecognized code processing of FIGS. 7 and 10.
Figure 10A:
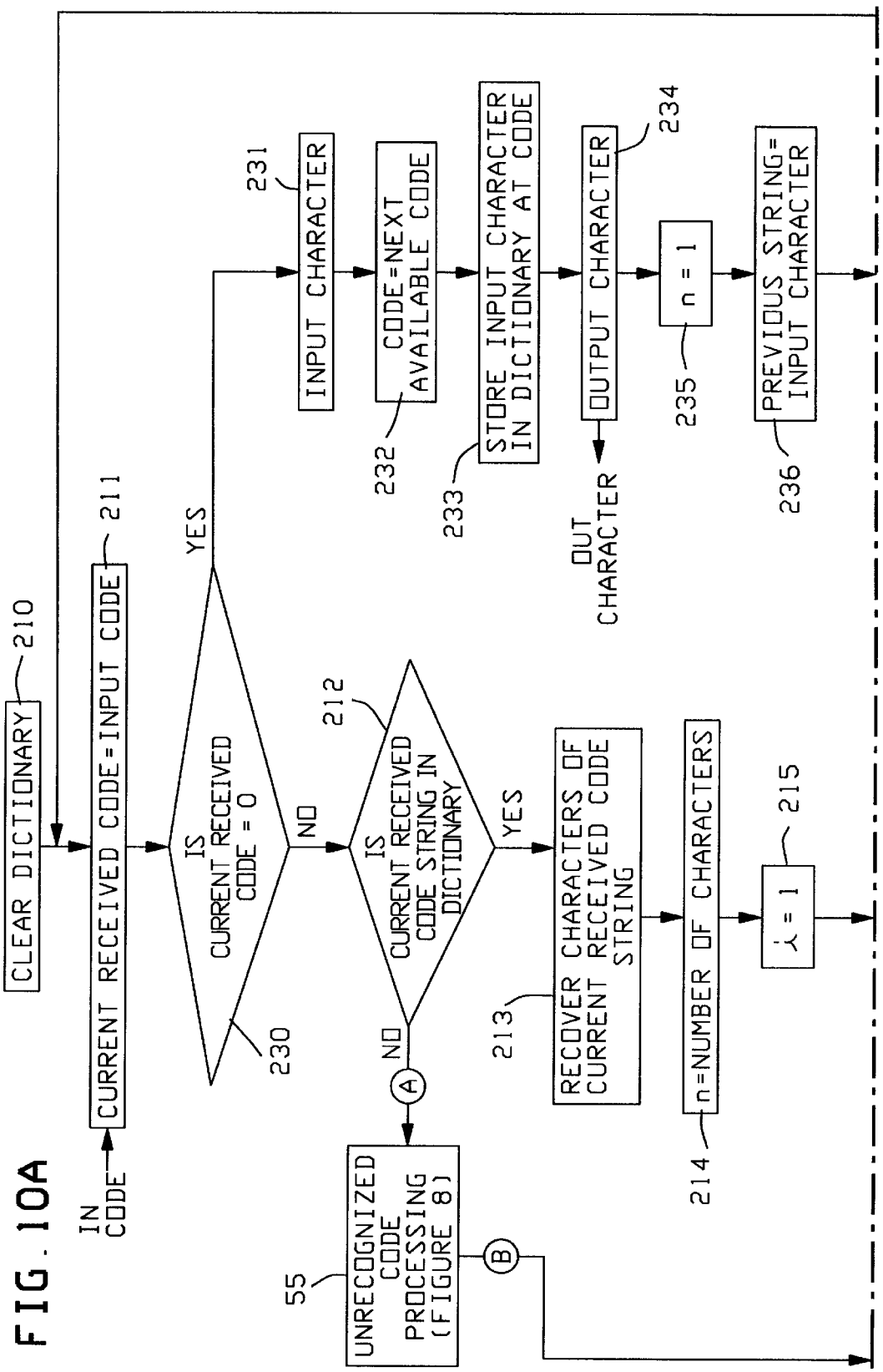

The recover and update control section 50 includes control 57 for controlling the operations of the decompression subsystem 40 in accordance with the operational flow charts of FIGS. 7, 8 and 10 in a manner to be described.

The decompression subsystem 40 includes a code register 60 that buffers the compressed code signals received at the input 41. The individual compressed code signals are applied from the code register 60 via a bus 61 to the current received code register 53 in accordance with operations to be described. The recover and update control section 50 controls acquiring compressed code signals from the code register 60 via a control bus 62.

The operation of the decompression subsystem 40 is briefly as follows. An input compressed code signal, inserted into the current received code register 53 accesses the corresponding string stored in the dictionary 43 via the addresses 44. The characters of the string are recovered from character field 47 as the recovery process traces the nodes of the string backward through the searchtree utilizing the related node pointers 48. The recovered characters of the string are provided in the appropriate order at the output 42. These string recovery operations are the same as those described in the above-cited references. The dictionary 43 is updated by extending the previously recovered string by each character of the currently recovered string. The previous string register 54 is utilized in this process.

An unrecognized compressed code signal that does not have a corresponding string stored in the dictionary 43 will be received in response to the compression subsystem 10 compressing a repeated character or character group string. When the unrecognized compressed code signal is received, the unrecognized code processing 55 is utilized to recover the string corresponding to the unrecognized compressed code signal. In addition, update strings corresponding to those that were stored in the dictionary 13 of the compression subsystem 10 during this compression process are also stored in the dictionary 43 of the decompression subsystem 40. Details of the unrecognized code processing 55 will be explained below with respect to FIG. 8.

Referring to FIG. 3a, a representational data structure for the nodes of the searchtrees of the dictionaries 13 and 43 is illustrated. Since, in the preferred embodiments of the invention, the same node data structure is utilized in both the compression subsystem 10 and the decompression subsystem 40, common reference numerals from both FIGS. 1 and 2 are shown in FIG. 3a. The node number 16,46 and character field 17,47 were explained above. The related node pointer fields 18,48 include a parent pointer field 66 and children pointer fields 67. In a well-known manner, the parent pointer field 66 contains the node number of the parent node of the current node 15,45 and the children pointer fields 67 contain the node numbers of the children nodes of the current node 15,45.

In a manner well appreciated in the art, the compression subsystem 10 effects a downward search through the searchtree as follows. When residing at a current node, the character value of the children nodes are examined to determine if any child node matches the current input character. If a match occurs, the child node becomes the current node and the process is repeated with the next input character until a current node is encountered that does not have a child node that matches the current input character. When this occurs, the longest matching string has been found in the dictionary 13 and the node number thereof is used as the compressed code signal for this longest matched string. A forward search through the searchtree begins at a root node whereat the parent pointer field 66 would contain a null value.

In an equivalent manner, as is known, the forward search can be performed by finding the next node to search from a hashing function of the current node number and the current input character. In such an embodiment, the children pointer fields 67 would not be utilized. The Welch patent ('302) discloses hash search embodiments of the LZW algorithm.

In a well-known manner, the data structure of FIG. 3a is also used by the decompression subsystem 40 in a backward search through the searchtree to recover a data character string corresponding to a compressed code signal. The compressed code signal addresses the node number 46 and the character value in the character field 47 is stored. The node number in the parent pointer field 66 is then utilized to access the parent node and the character value therein is stored. The process is continued until the root node is attained. Since the characters are recovered by this process in reverse order, a mechanism such as a LIFO stack or an appropriately configured output buffer is utilized to reverse the character order thereby recovering the original data character string.

A string stored in the compression dictionary 13 or in the decompression dictionary 43 is extended as follows. A next available code of an empty location is provided by the code generator 26 or 56 and the node number thereof is added to the children pointers 67 of the node being extended. The node number of the node being extended is inserted in the parent pointer field 66 of the empty location. The character value of the extension character is inserted in the character field 17 or 47 of the empty location.

Referring to FIG. 3b, a practical data structure for the nodes of the searchtrees of the dictionaries 13 and 43 is illustrated. This data structure and its implementations in a compression and decompression system are described in the Clark patent ('591). As explained with respect to FIG. 3a, the data structure of FIG. 3b may be utilized in both the compression dictionary 13 and the decompression dictionary 43 and thus common reference numerals from both FIGS. 1 and 2 are shown. Again, the node number 16,46 and character field 17,47 are explained above. In the data structure of FIG. 3b the related node pointer fields 18,48 comprise a parent pointer field 70, a child pointer field 71 and a sibling pointer field 72. The parent pointer field 70 is utilized in the same manner as described above with respect to the parent pointer field 66 of FIG. 3a. The child pointer field 71 and the sibling pointer field 72 replace the children pointer fields 67 of FIG. 3a. In the data structure of FIG. 3b a parent node uses its child pointer field 71 to point to the node number of one of its children nodes and the pointed to child node uses its sibling pointer field 72 to point to the node number of one of its sibling nodes. The pointed to sibling node, in turn, uses its sibling pointer field 72 to point to a further sibling node. In this manner, the pointers for all of the children of a parent node are contained in a linked list of sibling nodes.

A downward search is performed in the manner described above with respect to FIG. 3a, except that the presence of an input character is searched in the list of siblings. A backward search for the purposes of string recovery is performed in the manner described above with respect to FIG. 3a and implemented by setting the parent pointer field of the child and all of its siblings to the node number of the parent. In order to facilitate searching, the sibling list may be arranged in the order of ascending character value.

A string represented by a childless node (child pointer field=0) is extended by assigning the next available code, as described above, designating the next available empty location and inserting the node number of this empty location into the child pointer field 71 of the node being extended. The parent pointer field 70 of this newly created child node is set to the node number of the parent and the extension character value is inserted into the character field of the newly created child. If the node to be extended already has a child, a new sibling node is created and inserted into the sibling list by adjusting the sibling pointer fields 72 of the appropriate nodes of the sibling list. The node number of the parent is inserted into the parent pointer field 70 of the newly created sibling node.

Referring to FIGS. 4 and 4a, FIG. 4 schematically illustrates a searchtree node 80 in accordance with the data structure of FIG. 3a. The address (node number), character value, parent node and children nodes are as indicated by the legends. FIG. 4a is a representation of a partial searchtree illustrating data storage utilizing the arrangement of node 80 of FIG. 4. The partial searchtree of FIG. 4a is comprised of nodes 81, 82, 83 and 84 storing the strings ab, ac and ad. Thus, the children pointer fields 67 (FIG. 3a) of parent node 81 will contain the node numbers of children nodes 82, 83 and 84, while the parent pointer field 66 of the children nodes 82, 83 and 84 will each contain the node number of parent node 81.

Referring to FIGS. 5 and 5a, FIG. 5 schematically illustrates a searchtree node 90 in accordance with the data structure of FIG. 3b. The address (node number), character value, parent node, child node and sibling node are as indicated by the legends. FIG. 5a is a representation of a partial searchtree utilizing the arrangement of node 90 of FIG. 5 and is comprised of nodes 91, 92, 93 and 94. The partial searchtree of FIG. 5a stores the same strings as that of FIG. 4a. Thus, the child pointer field 71 (FIG. 3b) of the parent node 91 is set to the node number of child node 92. The sibling pointer field 72 of the child node 92 is set to the node number of sibling node 93 and the sibling pointer field 72 of the sibling node 93 is set to the node number of the sibling node 94. The parent pointer field 70 of the children nodes 92, 93 and 94 are each set to the node number of the parent node 91.

In the detailed descriptions of FIGS. 6–10 to follow, the operations will be explained in terms of the data structure of FIG. 3b, the corresponding node arrangement of FIG. 5 and the corresponding searchtree structure of FIG. 5a. Codes will be considered as assigned sequentially by the code generators 26 and 56 although it is appreciated that codes may be assigned pseudorandomly such as by hashing. In a hashing embodiment, a node number code and a character are hashed to determine a next following address. In such a hashing embodiment the child and sibling pointers would not be utilized. In the flow charts of FIGS. 6–10, however, the operating blocks CODE=NEXT AVAILABLE CODE encompass either a next sequential code or a next hashed code. In the sequential code assignment embodiments, these operational blocks will be more specifically CODE=CODE+1.

Referring to FIG. 6, with continued reference to FIGS. 1 and 3b, a control flow chart is illustrated showing the detailed operations to be executed by the search and update control section 20 so as to perform data compression in accordance with the invention. Control 27 is considered as containing appropriate circuitry such as state machines to control execution of the operations.

The flow chart of FIG. 6 is predicated on the compression dictionary 13 initialized with all single character strings. Accordingly, a block 100 provides for clearing and initializing the dictionary 13 with all of the single character strings stored at respective codes (node numbers). This operation is performed using the code generator 26 which sequentially assigns the node numbers for storing the single character strings. In an ASCII implementation, the first 256 codes will be assigned by the code generator 26 for storing the 256 single character strings. Initialization is effected by setting the character field 17 of the initialized memory locations to the character value of the respective characters of the alphabet over which the compression is occurring. The parent pointer field 70, child pointer field 71 and sibling pointer field 72 of these initialized locations are set to zero. It is appreciated that the initialized locations provide the root nodes for storing strings in the dictionary 13 and thus, the parent pointer fields 70 of these initialized locations will remain at zero.

By these operations, the initial locations of the dictionary 13 are set to contain the respective single character strings. In an ASCII embodiment, the first 256 locations of the dictionary 13 contain the respective 256 single character strings. In the operations of the block 100, the remaining locations of the dictionary 13 are cleared by setting all of the fields thereof to zero. In an ASCII implementation the dictionary locations with node numbers of 266 and greater are cleared.

At a block 101, the current match register 24 is set to zero and at a block 102 the previous match register 25 is set to zero. At a block 103, the next input character is placed into the current character register 23.

At a block 104, a search is made to determine if the current matched string concatenated by the current character is in the dictionary. Any known appropriate dictionary searching procedure, such as those described in the above-cited references, may be utilized. Specifically herein, for a non-zero current match, the current match register 24 contains the node number of the current matched string. The child pointed to by the child pointer field 71 of the current match node is compared with the input character. If the input character matches the child of the current node, then the decision of block 104 is answered in the affirmative and the YES path is taken. If the child node does not match the current character, the sibling list pointed to by the child node is inspected to determine if the current character matches a sibling. If a match is found, the YES path is taken. If, however, the current node is childless or the current character does not match any child of the current node, the NO path from the block 104 is taken.

If the current match is zero, the block 104 is seeking a root node in the dictionary 13 having the character value equal to the current character. Since the dictionary 13 is initialized with all single character strings, the YES branch from the block 104 is automatically taken.

When the YES branch from the block 104 is taken, the compression processing of FIG. 6 is at a point where the current match concatenated by the current character has been found in the dictionary 13 and the search for a still longer string will be continued. Accordingly, the current match is updated in a block 105 so that the new current match is set equal to the existing current match concatenated by the current character. This is accomplished by appropriately updating the node number in the current match register 24. When the current match is non-zero, the current match register 24 is updated with the node number of the child node (or sibling node) that matched the current character as discussed above. If the current match is zero, the current match register 24 is updated with the node number of the single character string that matched the current character. The single character node number can be obtained algorithmically in a well-known manner, or can be found by searching the initialized locations for the current character value.

If the NO branch is taken from the block 104, the current match concatenated by the current character does not match a string stored in the dictionary 13. The current match, that had been found in the dictionary, provides the longest match with the input data character stream, and the current character that was concatenated with the current match in the block 104 "broke" the match. At this point, a block 106 provides the compressed code signal representative of the longest match. This code of the longest match is found in the current match register 24 and is the node number of the current match.

In a block 107 the contents of the current match register 24 is transferred to the previous match register 25. Thus, the previous match register 25 now stores the node number of the location representative of the current longest match. The previous match register 25 is then utilized in updating the dictionary 13 in a manner to be further discussed.

After the current match is stored as the previous match, the current character is stored as the current match in a block 110. The block 110, therefore, begins the search for the next longest matched string utilizing, as the first or root character of the next match, the mismatching input character that broke the last match. In the block 110, therefore, the current match register 24 is set to the node number of the initialized single character root node having the value of the current character. This can be done either algorithmically or by searching in the manner described above with respect to the block 105. The block 110 leads into the dictionary updating logic to be described.

The block 110 may alternatively be implemented with the following logic. Instead of the current match being set to the current character, as in block 110, the current match can be set to zero and processing can be returned to the input of the block 104. The result of this alternative processing always leads to the YES path of the block 104 because of the dictionary initialization and thus to the block 105. It is appreciated that the same result is achieved by the block 110, as shown, with fewer processing steps. This logic is, however, used in the non-initialized compression processing of FIG. 9.

When the block 105 is reached, the current character extension of the current match has been found in the dictionary and, in accordance with the invention, the current character is utilized to extend the previous match to provide an update string to be stored in the dictionary 13. When, however, the block 105 is reached after only the first input character has been received, there will be no previous match and the dictionary 13 should not, at that point, be updated. Accordingly, a decision block 111 determines if the previous match is zero. This is accomplished by examining the previous match register 25 which was initially set to zero at block 102. If the previous match is zero, the YES path is taken from the block 111 bypassing the dictionary updating. When the block 105 is reached after the first input character has been processed, the previous match will be non-zero and the NO path from the block 111 will be taken to perform the dictionary updating in accordance with the present invention.

Accordingly, at a block 112, the code generator 26 provides the next available code. The next available code will be the node number of the next available empty dictionary location for storing the update string. At a block 113, the previous match concatenated by the current character is stored in the dictionary 13 at this next available empty location accessed by this next available code.

The storage of block 113 is achieved as follows. The parent pointer field 70 of the next available empty location accessed by the next available code of block 112 is set to the node number of the previous match found in the previous match register 25. The character field 17 of this next empty location is set to the value of the current character from the current character register 23. The previous match parent node is linked to this newly created node as follows. The node number of the previous match parent node is in the previous match register 25. If the previous match parent node is childless (child pointer field=0), the next available code from the block 112, which is the node number of the newly created child, is inserted into the child pointer field 71 of this previous match parent. If the previous match parent already has children, this next available code node number of the newly created node is inserted into the sibling list of the children of the previous match parent. This is done by adjusting a sibling pointer field 72 of a sibling in the list to accommodate the newly created sibling and to accordingly insert an appropriate sibling node number into the sibling pointer field 72 of the newly created sibling.

A block 114 is used to update the previous match register 25 so as to point to the node number of the previously matched string extended by the current character as described with respect to the block 113. This is accomplished by inserting the node number of the newly created child or sibling, as described with respect to the block 113, into the previous match register 25. This node number is the next available code described with respect to the block 112 and is provided by the code generator 26.

After the dictionary updating is performed pursuant to blocks 112–114, a decision block 115 is entered to determine if the current input character in the current character register 23 is the last input character in the input data stream. The block 115 is also entered from the YES path of block 111 to bypass dictionary updating as previously discussed. If the current character is the last character, the YES path from the block 115 is taken to a block 116 where the code of the current match is output. The compressed code output provided pursuant to the block 116 is found in the current match register 24. After outputting the compressed code pursuant to the block 116, a block 117 is entered ending the processing.

If, however, the current character in the current character register 23 is not the last input character, the NO branch is taken from the block 115 which returns to the input of the block 103 by a path 118. Pursuant to the block 103, the next input character is inserted into the current character register 23 and the data compression processing of FIG. 6 is continued.

If it is desired to temporarily suspend processing, the suspension is performed at a hold block 119 in the path 118.

It is appreciated from the foregoing, that blocks 103–105 control searching the dictionary 13 for the longest matched string and that block 106 provides the compressed code output corresponding to the longest match. The block 110 begins the search for a next longest match beginning with the character that caused the mismatch in the previous string matching cycle.

The blocks 107 and 112–114 control updating the dictionary 13 in accordance with the invention. When the block 104 determines that the current input character has successfully extended the current match, the blocks 112–114 concatenate this character with the previously matched string that is in the process of being extended. Thus, dictionary updating is immediate and interleaved on a character-by-character basis with the string search.

It is appreciated that when the current string being matched is on the same tree path as the previous string being extended, the property of the present algorithm of efficiently compressing a repeating character or character group string is achieved. Such an input string is compressed in two compressed code signals irrespective of its length as will be further clarified with respect to FIGS. 8 and 12.

Referring to FIG. 7, with continued reference to FIGS. 2 and 3b, a control flow chart is illustrated depicting the operations executed by the recover and update control section 50 for decompressing the compressed code generated in accordance with FIG. 6. FIG. 7 is predicated on the decompression dictionary 43 initialized with all single character strings. Control 57 is considered as containing appropriate circuitry, such as state machines, to control execution of the operations.

Pursuant to a block 130, the decompression dictionary 43 is cleared and initialized. The operations of the block 130 with respect to the dictionary 43 are the same as those described above with respect to the block 100 and compression dictionary 13.

At a block 131, the previous string register 54 is cleared to zero and at a block 132 an input compressed code is inserted into the current received code register 53.

Processing continues with a decision block 133 where it is determined if the current received code in the current received code register 53 has a corresponding string in the dictionary 43. Normally, the dictionary 43 will contain a string corresponding to the current received code. An exception occurs when the current received code resulted from the compressor encountering a repeating character or character group string. The decision of block 133 is effected by accessing the dictionary 43 using the current received code as an address and determining whether or not the accessed dictionary location is cleared. If the dictionary location is cleared, the string corresponding to the current received code is not in the dictionary. Alternatively, in the sequential code assignment embodiment, the decision of block 133 may be effected by determining if the current received code is less than or equal to the extant code of the code generator 56. When the current received code is less than or equal to the extant code of the code generator 56, a string corresponding to the current received code is in the dictionary 43. If, however, the current received code is greater than the extant code, the string corresponding to the current received code is not yet in the dictionary 43.

If the current received code string is not in the dictionary 43, the NO path from the block 133 is taken to the block 55 for executing unrecognized code processing. The details of unrecognized code processing will be described with respect to FIG. 8.

When the current received code has a corresponding string in the dictionary 43, the YES path from the block 133 is taken to a block 134. At block 134, the characters of the string corresponding to the current received code are recovered by an appropriate known dictionary look-up process (e.g. Welch patent ('302) FIG. 5 or Clark patent ('591) FIG. 5). A parameter n is provided at a block 135 and is set equal to the number of characters in the string recovered in block 134. An index i is set equal to 1 at a block 136. The index i is used to step through the n characters of the string recovered in the block 134 so that the characters of the recovered string are output beginning with the first character thereof. Accordingly, a block 137 provides for outputting the $i^{th}$ character of the current received code string.

A decision block 140 is included to determine if the previous string is equal to zero. This test is effected by determining if the contents of the previous string register 54 are zero. If the previous string register 54 is zero, the YES path from the block 140 is taken to bypass dictionary updating. The function of the block 140 is similar to that described above with respect to the block 111 of FIG. 6 and, therefore, the YES path from the block 140 is taken only in response to the first received input code.

When the previous string register 54 is not zero, the NO path from the block 140 is taken and at a block 141 the next available code for the next empty location of the dictionary 43 is provided by the code generator 56. At a block 142 the previous string concatenated with the $i^{th}$ character of the string corresponding to the current received code is stored at this next empty location. At a block 143 the previous string register 54 is updated to store the node number of the extended previous string of block 142. The operations performed in executing the blocks 141–143 are the same as those described above with respect to the blocks 112–114 of FIG. 6. In FIG. 7 the previous string register 54 is utilized, whereas in FIG. 6 the previous match register 25 is involved.

At a block 144, the index i is incremented by one. The YES path from the decision block 140 is also applied at an input to block 144 so that the dictionary update processing of blocks 141–143 is bypassed as previously described. At a decision block 145 a test is made to determine if the index i has attained the value n+1. When the index i is not equal to n+1, the NO path is taken from block 145 which returns processing to the input of the block 137. Processing through the blocks 137 and 140–145 is continued until i=n+1.

In this manner, the n characters of the current received code string are output in the correct order at the block 137 and the previous recovered string is extended by all of the prefixes of the current received code string. The processing of the blocks 141–143 stores the same strings in the decompression dictionary 43 as are stored by the blocks 112–114 of FIG. 6 in the compression dictionary 13. The strings stored pursuant to the blocks 141–143 in the decompression dictionary 43 are stored at the same respective addresses as the strings stored pursuant to the blocks 112–114 in the compression dictionary 13.

When the index i attains the value n+1, the YES path from the block 145 is taken to a block 146. At block 146 the current received code string replaces the previous string in preparation for processing the next input code. This is achieved by inserting the contents of the current received code register 53 into the previous string register 54. The unrecognized code processing 55 exits as an input into block 146.

If the current received code just processed is not the last input code, a decision block 147 returns processing to the input of block 132 via the NO path of block 147. Processing returns to the block 132 via a path 148 to initiate processing the next input compressed code. If it is desired to temporarily suspend processing, the suspension is performed at a hold block 149 in the path 148. The hold block 149 in the decompressor corresponds to the hold block 119 in the compressor.

If, at the block 147, the current received code is the last input code, the YES path from the block 147 is taken to block 150 to terminate processing.

It is appreciated from the foregoing that the blocks 134 and 137 recover and output the characters of the string corresponding to the current received code, while the blocks 141–143 update the dictionary 43 by storing the previous recovered string extended by the prefixes of the current recovered string.

Referring to FIG. 8, details of the unrecognized code processing 55 are illustrated. At a block 160, the index i is set equal to one and, for reasons to be described, will be incremented modulo n. At a block 161, the n characters of the previous string are recovered. The previous string has n characters since this was the current received code string in the previous string recovery cycle. The block 161 is implemented by accessing the dictionary 43 with the contents of the previous string register 54 utilizing the known dictionary string recovery process as discussed above with respect to the block 134.

At a block 162, the code generator 56 provides the next available code for the next empty dictionary location. At a block 163, the previous string extended by the $i^{th}$ character of the previous string is stored at this next empty location. At a block 164, the previous string is replaced by the extended previous string of block 163 by updating the previous string register 54 to store the node number of this extended previous string. The dictionary updating operations of blocks 162–164 are similar to those described above with respect to blocks 141–143. As previously explained, the implementation of the dictionary updating of blocks 141–143 had been described in detail with respect to blocks 112–114 of FIG. 6. In the processing of the blocks 162–164, the previous string register 54 is utilized.

At a decision block 165, a test is made to determine if the code currently provided by the code generator 56 is equal to the current received code in the current received code register 53. If the extant code of the code generator 56 has not attained the value of the current received code, the NO path from the block 165 is taken to a block 166 wherein the index i is incremented modulo n by one. Processing then loops back to the input of block 162 to store additional update strings until the extant code of the code generator 56 equals the current received code.

When block 165 indicates that the extant code of the code generator 56 is equal to the current received code in the current received code register 53, the YES path from the block 165 is taken to a block 167. It is appreciated that when the block 165 indicates the code is equal to the current received code, the string corresponding to this unrecognized current received code is now stored in the decompression dictionary 43.

At the block 167 the characters of the string corresponding to the current received code are recovered and each character is output beginning with the first character. The block 167 is implemented by accessing the dictionary 43 with the contents of the current received code register 53 and utilizing the known dictionary string recovery procedures discussed above with respect to the block 134.

It is appreciated from the foregoing that by the processing of the blocks 160–167, the string corresponding to the unrecognized compressed input code is constructed, stored in the decompression dictionary 43 and the characters thereof recovered for outputting. It is further appreciated that when the compressor of FIG. 6 generates and stores the strings associated with an unrecognized code, the compressor stores n strings beyond the string corresponding to the transmitted code. This will be further clarified with respect to FIG. 12. The processing at the decompressor to construct and store these n strings is as follows.

Processing proceeds to a block 170 whereat the index i is incremented modulo n by one. Blocks 171–173 duplicate the processing of blocks 162–164, respectively. Processing then proceeds to a block 174 whereat the parameter n is decremented by one. The parameter n is then tested in a decision block 175 to determine if n is equal to zero. If n is not yet zero, the NO path is taken from the block 175 back to the input of the block 170. When the parameter n attains the value of zero, the unrecognized code processing exits on the YES path of the block 175.

In the blocks 166 and 170, the index i is incremented modulo n to facilitate providing the appropriate character values for the strings stored pursuant to blocks 163 and 172. The value of n used is that provided by block 135 (FIG. 7) and prior to decrementing in block 174. The character values are those of the n characters of the previous string recovered pursuant to block 161 and as indexed by i. The n characters of the previous string recovered pursuant to block 161 form an n character prefix for the strings constructed and stored pursuant to blocks 163 and 172.

The processing of FIG. 8 functions for any type of code assignment process used by the code generators 26 and 56 including sequential or pseudorandom code assignment such as by hashing. When the code assignment process is sequential, the logic of FIG. 8 can be simplified as follows.

For sequential code assignment, the test of the block 165 becomes "Code=Current Received Code+n". The blocks 170–175 are eliminated and the unrecognized code processing exits from block 167.

It is appreciated from the foregoing that block 167 recovers the characters of the string corresponding to the unrecognized received code and that blocks 163 and 172 store the same strings in the decompression dictionary 43 as are stored in the compression dictionary 13 when the repeated character or character group string occurs as discussed above with respect to FIG. 6.

Referring to FIG. 9, with continued reference to FIGS. 1 and 3b, a control flow chart of detailed operations to be executed by the search and update control section 20 so as to perform data compression in accordance with the invention is illustrated. Control 27 is considered as containing appropriate circuitry, such as state machines, to control execution of the operations. The flow chart of FIG. 9 is predicated on a non-initialized compression dictionary 13. In the non-initialized embodiment of FIG. 9 when a character is encountered for the first time, a zero code is transmitted followed by transmission of the character in uncompressed form. The zero code provides an indication to the decompressor that such a character has been transmitted by the compressor. The character that is encountered for the first time is stored in the compressor dictionary 13 to function as a stored single character string or root node with respect to subsequent encounters of the character. Except for the accommodation of the characters encountered for the first time, the flow chart of FIG. 9 functions in the same manner as that of FIG. 6.

At a block 180 the dictionary 13 is cleared. Dictionary clearing may be performed by setting fields 17 and 70–72 of FIG. 3b to zero.

The flow chart of FIG. 9 includes blocks 181–187 and 190–194. These blocks are the same as blocks 101, 103–107 and 112–117, respectively, of FIG. 6. The explanations given above with respect to these blocks of FIG. 6 apply to the corresponding blocks of FIG. 9 except as follows.

In block 183, when the current match is zero, a search in the dictionary 13 is effected to determine if the single character string has already been entered into the dictionary as a root node. If the single character string is already in the dictionary, the YES path from the block 183 is taken, otherwise the NO path is taken. In block 184, when the current match is zero, the current match register 24 is updated with the node number of the single character root node that was matched in the block 183. Additionally, with respect to the block 187 in a sequential code assignment embodiment, the code assignments will begin with unity since, in this non-initialized embodiment,. all dictionary locations are available for storing strings as they are encountered in the input. It is also noted that the block 111 in FIG. 6 that bypasses the dictionary updating is not required in FIG. 9. This follows because, in this non-initialized embodiment, the first input character is a character that is encountered for the first time providing a previous match for the next iteration as will be described below.

Additionally, the block 185 corresponds with the block 106 of FIG. 6. In the block 185, as in block 106, the compressed output code is found in the current match register 24. In the block 185, however, when the current match is zero, this zero code is output indicating that the current input character is a character that has been encountered for the first time.

The flow chart of FIG. 9 includes a decision block 195 that determines if the contents of the current match register 24 is equal to zero. If the current match is not zero, the NO path from the block 195 is taken to the block 186 whereat the contents of the current match register 24 is transferred to the previous match register 25 as described above with respect to corresponding block 107 of FIG. 6. At a block 196, the current match register 24 is set to zero and processing transfers to the input of the block 183. The block 186 sets up the dictionary updating for the next string parsing operation and the block 196 causes the next string search to begin with the character in the current character register 23.

If the YES path from the block 195 is taken, the current match is equal to zero and the character in the current character register 23 has been encountered for the first time. Thus, at a block 197 this character is output. Since the block 185 had output the zero valued current match, this first encountered current character, that was output at the block 197, was preceded by the zero code as discussed above. At a block 200, the next available code is provided by the code generator 26 indicating the next available empty location in the dictionary 13. At a block 201, the current character in the current character register 23 is stored at this next empty location as a single character string root node. The function of the block 201 is accomplished by storing the character from the current character register 23 into the character field 17 of this next empty location. The parent pointer field 70, child pointer field 71 and sibling pointer field 72 will all have been previously zeroed at the block 180.

At a block 202, the previous match register 25 is set to the root node created in the block 201 for the purpose of dictionary updating in the next string parsing operation. This is achieved by inserting into the previous match register 25, the node number of this root node newly created at block 201. This node number will be the code just provided at block 200.

A decision block 203 is included to determine if the character in the current character register 23 is the last input character. If not, the NO path from the block 203 is taken to the input of the block 182 to acquire the next data character signal from the input stream. If, however, the current character tested at the block 203 is the last input character, the YES path from the block 203 is taken to the block 194 to terminate the processing.

It is appreciated from the foregoing that blocks 182–184 control searching the dictionary 13 for the longest matched string and that block 185 provides the compressed code output corresponding to the longest match. The block 185 also provides the zero code output that precedes transmission of a character encountered for the first time. The block 196 begins the search for a next longest match by zeroing the current match register 24. Thus, the search for the next longest match begins with the character that caused the mismatch in the previous string matching cycle, which character is in the current character register 23.

The blocks 186, 187, 190 and 191 control updating the dictionary 13 in accordance with the invention. When the block 183 determines that the current input character has successfully extended the current match, the blocks 187, 190 and 191 concatenate this character with the previously matched string that is in the process of being extended. The blocks 195, 197 and 200–202 control the management of characters that are encountered for the first time. The block 202 provides such a character as a previous match for potential extending in the next string matching cycle. It is appreciated from the logic of FIG. 9 that if several such first encountered characters are received sequentially, only the last of these characters will be extended in the next string matching cycle.

Referring to FIG. 10, with continued reference to FIGS. 2 and 3b, a control flow chart depicting the operations executed by the recover and update control section 50 for decompressing the compressed code generated in accordance with FIG. 9 is illustrated. The flow chart of FIG. 10 is predicated on a non-initialized decompression dictionary. Control 57 is considered as containing appropriate circuitry, such as state machines, to control execution of the operations.

At a block 210, the decompression dictionary 43 is cleared in the manner described above with respect to the block 180 of FIG. 9. Thus, the decompression dictionary 43 is cleared in identically the same manner as the dictionary 13 of the non-initialized embodiment of FIG. 9.

The operations performed by the decompression flow chart of FIG. 10 are the same as those performed by the decompression flow chart of FIG. 7 except with respect to managing the characters encountered for the first time as discussed above with respect to FIG. 9. Accordingly, FIG. 10 includes blocks 55, 211–217 and 220–226 which perform the same functions as the blocks 55, 132–137, 141–147 and 150 of FIG. 7, respectively. The descriptions given above with respect to blocks 55, 132–137, 141–147 and 150 of FIG. 7 apply to the corresponding blocks of FIG. 10.

A block corresponding to the block 140 of FIG. 7 is not utilized in FIG. 10. As previously described, the block 140 bypasses dictionary updating when the previous string register 54 is zero. This occurs in response to the first received input code in the initialized embodiment of FIG. 7. In the non-initialized embodiment of FIG. 10, the first received input code is for a character encountered for the first time, thereby providing a previous string for updating in subsequent cycles as will be described.

The processing of the blocks 217, 220 and 221 stores the same strings in the decompression dictionary 43 as are stored by the blocks 187, 190 and 191 of FIG. 9 in the compression dictionary 13. The strings stored pursuant to the blocks 217, 220 and 221 in the decompression dictionary 43 are stored at the same respective addresses as the strings stored pursuant to the blocks 187, 190 and 191 in the compression dictionary 13. Furthermore, when the unrecognized code processing of block 55 (FIG. 8) is performed in the context of FIG. 10, the blocks 163 and 172 of FIG. 8 store the same strings in the decompression dictionary 43 as are stored in the compression dictionary 13 when the repeated character or character group string occurs with respect to the operation of the compressor of FIG. 9.

Specifically, the block 212 corresponds with the block 133 of FIG. 7. The descriptions given above with respect to the block 133 apply to the block 212 except with respect to the zero received code that precedes receipt of a character that was encountered for the first time by the compressor. It is appreciated, however, that when processing reaches the block 212, the current received code will not be zero since this situation is handled in another branch of FIG. 10 now to be described.

At the block 211, an input compressed code signal is inserted into the current received code register 53. A decision block 230 tests the contents of the current received code register 53 to determine if the current received code is zero. If the current received code is not zero, the NO path from the block 230 is taken as an input to the block 212 where processing proceeds as previously described.

If, however, the current received code is zero, a character that was encountered for the first time by the compressor of FIG. 9 is expected. Accordingly, this character is input at a block 231. The current received code register 53 may be utilized to temporarily hold this character. At a block 232, the code generator 56 provides the next available code corresponding to the next empty location of the decompression dictionary 43. At a block 233 the input character is stored at this next empty location as a single character root node. This is accomplished at block 233 in the manner described above with respect to the block 201 of FIG. 9. Thus, the decompression subsystem 40 stores the same single character strings in the decompression dictionary 43, and at the same addresses, as the compression system 10 stores in the compression dictionary 13 in the non-initialized embodiment of FIG. 9.

At a block 234, the character received at the block 231 is output to maintain consistency between the recovered data output of the decompressor and the input data received at the compressor. This may be accomplished by outputting this character from the current received code register 53 where the character was temporarily stored.

At a block 235, the parameter n is set to one. If this character, which was encountered for the first time and just processed, should repeat at the input of the compressor, thereby generating an unrecognized compressed code, n=1 is the appropriate value for the unrecognized code processing 55 that would be performed in the next decompressor cycle.

At a block 236, the previous string register 54 is set to the root node created in the block 233 for the purpose of dictionary updating in the next string recovery cycle. This is achieved by inserting the node number of this root node newly created at the block 233 into the previous string register 54. This node number will be the code just provided at block 232. It will be appreciated from the logic of FIG. 10 that if several characters, each encountered for the first time, are received sequentially, only the last such character will be extended in the next string recovery cycle in a manner similar to that described with respect to FIG. 9.

The output of the block 236 provides an input to the block 225 to continue the processing as described above.

Figure 11A:
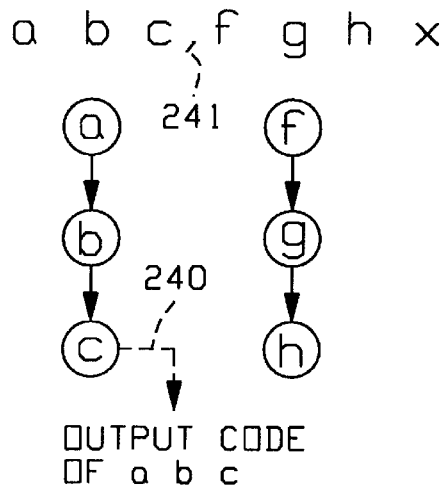
FIGS. 11a–11e are schematic representations of partial searchtrees illustrating consecutive states of the compression dictionary when compressing a typical input data character stream.

Referring to FIGS. 11a–11e, consecutive states of the compression dictionary 13, when compressing a typical input data stream, are illustrated. The dictionary states are schematically represented by partial searchtrees. As indicated, the input stream being compressed is "abcfghx". The commas illustrated, representing string parsing, are virtual and not in the input stream. Underscoring indicates the current input character. As indicated in FIG. 11a, the dictionary 13 initially stores the strings "abc" and "fgh". In FIG. 11a the string "abc" has just been matched as the longest matched string and the code of "abc" is output as indicated by an arrow 240. The string "abc" has, therefore, been parsed from the input as indicated by a virtual comma 241.

Figure 11B:
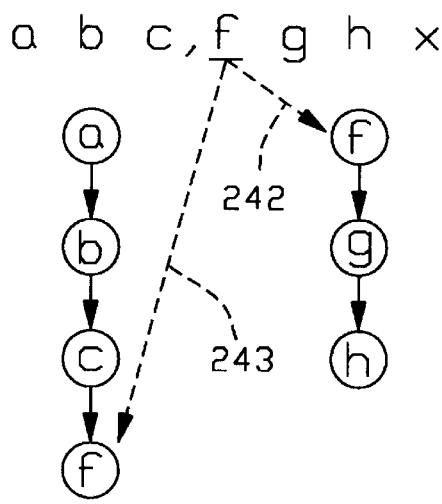

In FIG. 11b, the next input character "f" matches the first character of the string "fgh" as indicated by an arrow 242. In accordance with the invention, the string "abc", transmitted as the previous compressed code in FIG. 11a, is extended by the character "f" as indicated by an arrow 243.

Figure 11C:
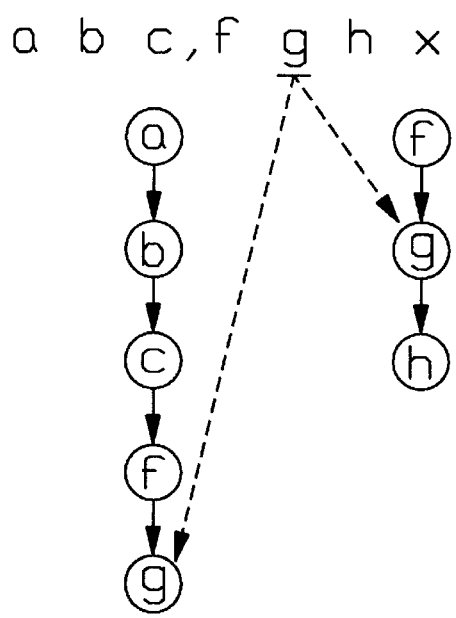
Figure 11D:
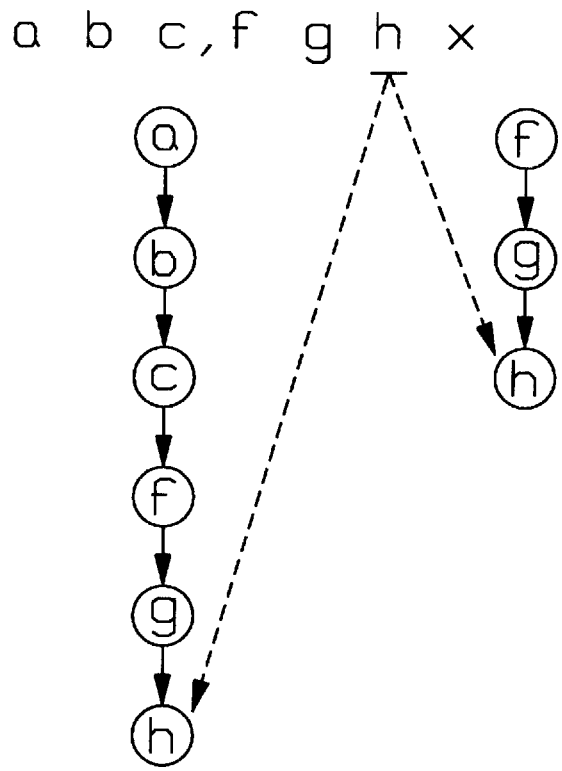

In FIG. 11c, the next input character "g" matches the second character of the stored string "fgh" and the previous extended string "abcf" is now extended by the matching input character "g". Similarly, in FIG. 11d the input character "h" matches the third character of the string "fgh" and is appended to the growing previous string to now form the string "abcfgh".

Figure 11E:
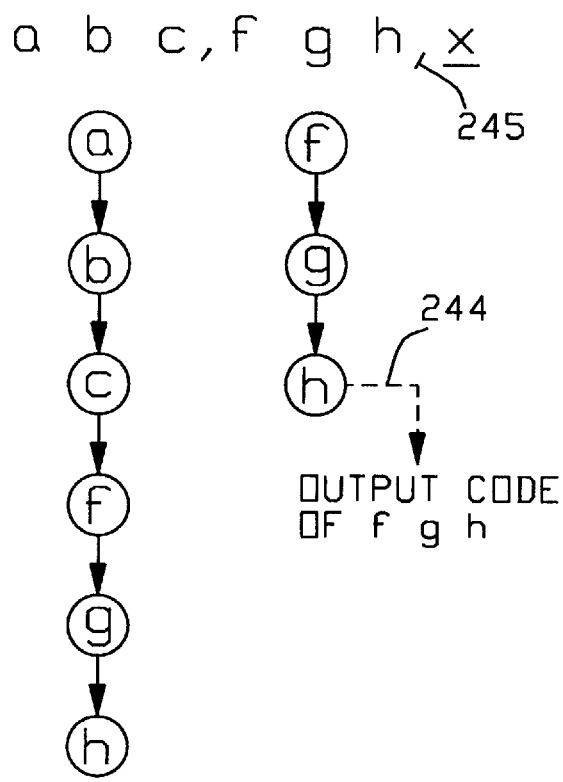

In FIG. 11e, the next input character "x" breaks the match of the string "fgh" and the code of the longest match "fgh" is output as indicated by an arrow 244. The string "fgh" has been parsed from the input as indicated by a virtual comma 245.

It is appreciated from FIGS. 11a–11e that the stored string "abc" has been extended by all of the prefixes of the matched string "fgh" and that the dictionary updating is immediate and interleaved with the matching of each of the characters of the current matched string. Thus, in FIG. 11b the string "abcf" was available for matching in the next iteration. In FIG. 11c the string "abcfg" was available for matching in the next iteration and in FIG. 11d the string "abcfgh" was available for matching in the next iteration.

It is further appreciated from FIGS. 11a–11e that the decompressor receives the consecutive compressed output codes for "abc" and "fgh". When the output code for "fgh" is received, the decompressor utilizes the recovered string "fgh" and the string "abc", corresponding to the previously received compressed code, to construct and store the strings described and illustrated in FIGS. 11a–11e.

Referring to FIGS. 12a–12g, the manner in which the immediate and interleaved dictionary updating aspect of the present invention provides a run length encoding advantage is demonstrated. As discussed above, the present invention compresses a repeating character or character group run in two compressed code symbols regardless of the length of the run. FIGS. 12a–12g are schematic representations of partial searchtrees illustrating consecutive states of the compression dictionary 13 when the input data character stream is a repeating character group. The input data stream is illustrated as "ababax". In this sample input it is noted that the repeating character group run terminates with a fragment of the character group. The operations described below are also applicable to termination of the run by the complete character group. As in FIGS. 11a–11e, the virtual commas represent string parsing and the underscoring represents the current input character.

In FIG. 12a, the compression dictionary 13 is storing the string "ab" which is matched by the first two input characters. Thus, the code of "ab" is output as indicated by an arrow 250. The parsing of the string "ab" from the input is indicated by a virtual comma 251.

In FIG. 12b, the current input character "a" matches the first character of the stored string "ab", as indicated by an arrow 252. Since the code for "ab" was transmitted as the previous compressed code, the matching character "a" is appended to the string "ab" as indicated by an arrow 253. The compression dictionary 13 now stores the string "aba" which can be utilized for matching.

In FIG. 12c, the next input character "b" matches the second character of the stored string "aba" and, accordingly, the string "aba" is extended by this character. Thus, the compression dictionary 13 now stores the string "abab" which is available for matching.

Figure 12E:
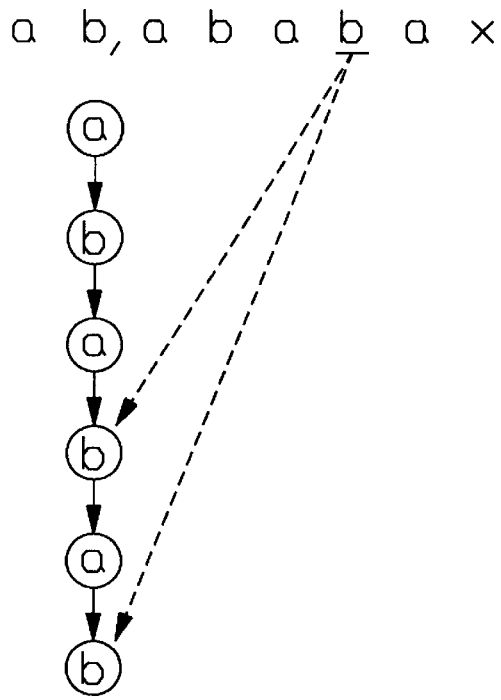
Figure 12F:
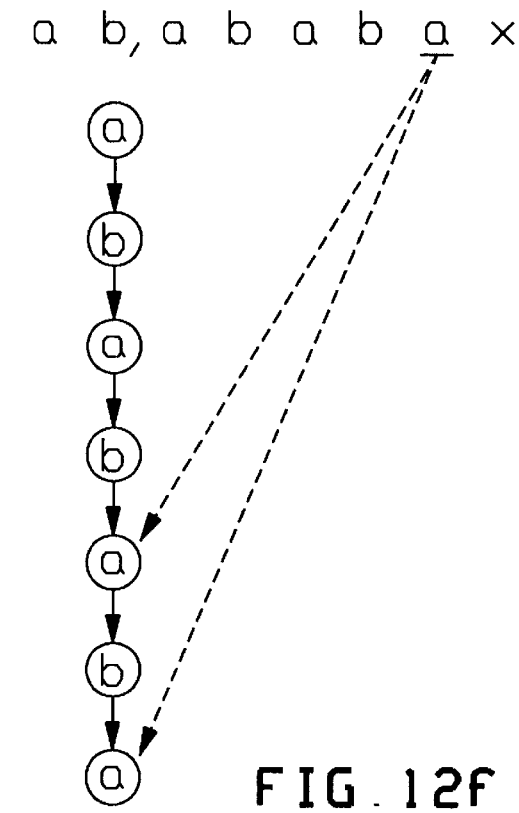

This sequence of input character matching and string extending is illustrated for the next three input characters in FIGS. 12d–12f. Thus, in FIG. 12d the string "ababa" is stored and available for matching, in FIG. 12e the string "ababab" is stored and available for matching, and in FIG. 12f the string "abababa" is stored and available for matching.

It is appreciated that as this repeating sequence continues, the input character matching and stored string extending is performed on the same branch of the tree and would continue until a character is received that would break the match. As this is occurring, the code generator 26 (FIG. 1) is continuously providing new codes so as to store the strings at the newly created nodes. Up to this point, the decompressor is unaware of the activities, as illustrated in FIGS. 12b–12f, occurring at the compressor. The last information received by the decompressor was the output code of the string "ab" as described with respect to FIG. 12a.

Figure 12G:
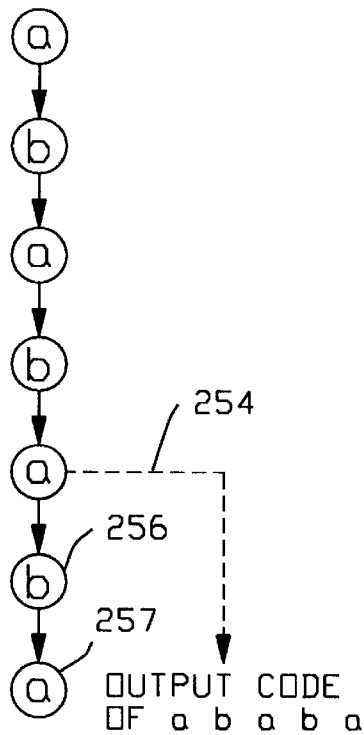

In FIG. 12g, the input character "x" breaks the match since the string "ababax" is not found in the compressor dictionary 13. Accordingly, the code of the longest match "ababa" is output as indicated by an arrow 254. This string has, accordingly, been parsed from the input as indicated by a virtual comma 255. It is appreciated from FIG. 12g that two additional strings have been stored in the compressor dictionary 13 beyond the longest matched string. These strings are represented by nodes 256 and 257.

Thus, it is appreciated from FIGS. 12a–12g that the repeating character group string "ababa" was compressed in two code symbols as indicated by reference numerals 250 and 254. It is further appreciated that if the repeating run of the code group "ab" had been continued beyond FIG. 12f for a longer run than illustrated, only two code symbols would still be utilized for the compression. It is seen, that the repeating run ends at a fragment of the repeating character group but could also continue to terminate at the complete group "ab".

It is appreciated from the foregoing that the output code indicated in FIG. 12g by reference numeral 254 will be unrecognized at the decompressor since the decompressor is not yet storing the string "ababa". The unrecognized code processing of FIG. 8 constructs and stores the string "ababa", as well as the prefixes thereof shown in FIGS. 12b and 12c. The unrecognized code processing furthermore constructs and stores the additional extended strings designated by reference numerals 256 and 257 in FIG. 12g.

In FIG. 8 the processing of blocks 160–167 constructs, stores and outputs the string "ababa" corresponding to the unrecognized compressed code indicated by the arrow 254. The processing of blocks 170–175 constructs and stores the additional strings 256 and 257.

In the example of FIGS. 12a–12g, the previous string used in the unrecognized code processing is the string "ab" which was already stored in the decompressor dictionary when the decompressor performed the string recovery cycle corresponding to FIG. 12a. In FIG. 8, the parameter n is 2 and the index i is incremented modulo 2 thereby sequentially and repeatedly providing the characters "ab" for the blocks 163 and 172 so as to construct the strings illustrated in FIG. 12b–12f.

It is further appreciated from the foregoing that the unrecognized code processing constructs and recovers the appropriate strings when the repeating character or repeating character group run is terminated by a mismatching character or by running out of input characters. The run may terminate with a fragment of the multi-character group of a repeating character group run or with the complete group. FIGS. 12a–12g illustrate termination by the mismatching character "x" and further illustrate termination with a fragment of the repeating group. In FIG. 12g the run ends with the fragment "a" of the repeating group "ab". When the repeating group run terminates with the complete group "ab", the appropriate operations are readily appreciated from the above-given descriptions.

It is appreciated from the foregoing that the above-described processing preserves the prefix property for the strings stored in the dictionaries 13 and 43 in that the prefixes of the stored strings also exist in the dictionaries.

The above embodiments compress a stream of input data character signals. The input data characters can be over any size alphabet having any corresponding character bit size. For example, the data characters can be textual, such as ASCII characters, over an alphabet, such as the 256 character ASCII alphabet of eight-bit characters. The input data can also be binary characters over the two character binary alphabet 1 and 0 having a one-bit sized character. This type of alphabet occurs, for example, in bit mapped images. It is appreciated that textual data can also be compressed over the two character alphabet of the underlying binary data.

The above embodiments were described in terms of searching for the longest match. It is appreciated that the immediate and interleaved updating process of the present invention can also be used in systems that match strings that are not necessarily the longest.

It is appreciated that the above-described embodiments of the invention may be implemented in hardware, firmware, software or a combination thereof. Discrete circuit components may readily be implemented for performing the various described functions. In a software embodiment, appropriate microprocessors, programmed with coding readily generated from the above-described flow charts, may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

We claim:

1. Data compression apparatus for compressing a stream of data character signals into a stream of compressed code signals, comprising storage means for storing strings of data character signals, each said string having a code signal associated therewith, means for searching said stream of data character signals by comparing said stream to said stored strings to perform a character-by-character match therewith until a predetermined match is determined, means for providing the code signal associated with said predetermined match so as to provide said stream of compressed code signals, means for entering extended strings into said storage means, the entry of said extended strings being interleaved with the matching of the data character signals of said character-by-character match, an extended string PWC comprising a previously matched string P corresponding to a last provided code signal extended by a string WC, where W is a partial string in the process of being matched during said character-by-character match and C is a data character signal continuing the match of W during said character-by-character match, and means for assigning respective code signals to said extended strings.

2. The apparatus of claim 1 wherein said means for entering is operative to enter one of said extended strings into said storage means as each said data character signal is matched and before a next data character signal is matched.

3. The apparatus of claim 2 wherein said predetermined match comprises the longest match between said stream of data character signals and said stored strings, said means for providing being operative for providing the code signal associated with said longest match so as to provide said stream of compressed code signals.

4. The apparatus of claim 3 wherein said apparatus operates in successive string matching cycles, respective longest matched strings being determined in said successive cycles, a current cycle following a previous cycle, said previously matched string being matched in said previous cycle with said last provided code signal being provided in said previous cycle, said character-by-character match occurring in said current cycle with said previously matched string being extended by said each data character signal during said current cycle.

5. Data compression apparatus for compressing a stream of data character signals into a stream of compressed code signals, comprising storage means for storing strings of data character signals, each said string having a code signal associated therewith, means for searching said stream of data character signals by comparing said stream to said stored strings to perform a character-by-character match therewith until a predetermined match is determined, means for providing the code signal associated with said predetermined match so as to provide said stream of compressed code signals, means for entering into said storage means, interleaved with said character-by-character match, extended strings comprising a previously matched string corresponding to a last provided code signal extended by each data character signal, in turn, as each data character signal is matched, and means for assigning respective code signals to said extended strings, said apparatus operating in successive string matching cycles, a current cycle following a previous cycle, said means for searching and said means for entering being operative so that when a partial string W and a data character signal C are matched, one of said extended strings is entered into said storage means with said data character signal C as an extension character of a string PW where P is said previously matched string and W is in the process of being matched in said current cycle.

6. The apparatus of claim 4 wherein said means for searching is operative for determining when said longest match has been achieved by determining when a data character signal fails to match during said character-by-character match, said means for searching includes means for beginning a next string matching cycle with said data character signal that failed to match.

7. The apparatus of claim 1 further including means for initializing said storage means with all single character strings with respective codes associated therewith.

8. The apparatus of claim 1 further including means for outputting a data character signal encountered for the first time in uncompressed form following an indication that such a data character signal is being output, and means for entering said data character signal encountered for the first time into said storage means as a single character string.

9. The apparatus of claim 8 wherein said indication comprises a zero code.

10. Data compression apparatus for compressing a stream of data character signals into a stream of compressed code signals, comprising storage means for storing strings of data character signals, each said string having a code signal associated therewith, means for searching said stream of data character signals by comparing said stream to said stored strings to perform a character-by-character match therewith until a predetermined match is determined, means for providing the code signal associated with said predetermined match so as to provide said stream of compressed code signals, means for entering into said storage means, interleaved with said character-by-character match, extended strings comprising a previously matched string corresponding to a last provided code signal extended by each data character signal, in turn, as each data character signal is matched, and means for assigning respective code signals to said extended strings, said strings being stored in said storage means in a linked tree structure and said stream of data character signals including a repeating character string comprised of a repeating character, said apparatus being operative for compressing said repeating character string in two compressed code signals irrespective of the length thereof.

11. The apparatus of claim 10 wherein said previously matched string comprises said repeating character, said means for searching is operative to match said repeating character string on a path through said tree, and said means for entering is operative to enter said extended strings on said path, thereby compressing said repeating character string in two compressed code signals irrespective of the length thereof.

12. Data compression apparatus for compressing a stream of data character signals into a stream of compressed code signals, comprising storage means for storing strings of data character signals, each said string having a code signal associated therewith, means for searching said stream of data character signals by comparing said stream to said stored strings to perform a character-by-character match therewith until a predetermined match is determined, means for providing the code signal associated with said predetermined match so as to provide said stream of compressed code signals, means for entering into said storage means, interleaved with said character-by-character match, extended strings comprising a previously matched string corresponding to a last provided code signal extended by each data character signal, in turn, as each data character signal is matched, and means for assigning respective code signals to said extended strings, said strings being stored in said storage means, in a linked tree structure and said stream of data character signals including a repeating character group string comprised of a repeating character group, said apparatus being operative for compressing said repeating character group string in two compressed code signals irrespective of the length thereof.

13. The apparatus of claim 12 wherein said previously matched string comprises said repeating character group, said means for searching is operative to match said repeating character group string on a path through said tree, and said means for entering is operative to enter said extended strings on said path, thereby compressing said repeating character group string in two compressed code signals irrespective of the length thereof.

14. Data decompression apparatus for receiving a stream of compressed code signals provided by a data compressor responsive to a stream of data character signals, said apparatus operative for recovering said stream of data character signals from said stream of compressed code signals, comprising storage means for storing strings of data character signals, each said string having a code signal associated therewith, means for accessing said storage means with a current received compressed code signal for recovering a string from said storage means corresponding to said current received compressed code signal so as to recover the data character signals thereof, means for entering into said storage means, extended strings comprising a previously recovered string corresponding to a previously received compressed code signal extended by each data character signal, in turn, of said recovered string corresponding to said current received compressed code signal, means for assigning respective code signals to said extended strings, further means for entering into said storage means, further extended strings in response to receiving an unrecognized compressed code signal, said further extended strings comprising said previously recovered string corresponding to said previously received compressed code signal extended by each data character signal, in turn, of said previously recovered string, sequentially and repeatedly, until a string corresponding to said unrecognized compressed code signal is entered, means for assigning respective code signals to said further extended strings, and means for providing the data character signals of said string corresponding to said unrecognized compressed code signal so as to recover said data character signals.

15. The apparatus of claim 14 wherein said further means for entering is operative for entering into said storage means, additional extended strings comprising said string corresponding to said unrecognized compressed code signal further extended by the data character signals of said previously recovered string, in turn, until a number of said additional extended strings are entered into said storage means, said number being equal to the number of data character signals comprising said previously recovered string, means for assigning respective code signals to said additional extended strings.

16. The apparatus of claim 15 wherein said apparatus operates in successive string recovery cycles, respective strings being recovered in said successive cycles, a current cycle following a previous cycle, said previously recovered string being recovered in said previous cycle with said previously received compressed code signal being received in said previous cycle, said current received compressed code signal being received during said current cycle, and said means for entering being operative for entering said extended strings into said storage means during said current cycle.

17. The apparatus of claim 16 wherein said unrecognized compressed code signal is received during said current cycle, said further means for entering being operative for entering said further extended strings and said additional extended strings into said storage means during said current cycle.

18. The apparatus of claim 14 further including means for initializing said storage means with all single character strings with respective codes associated therewith.

19. The apparatus of claim 14 wherein said stream of compressed code signals includes a data character signal in uncompressed form following an indication that such a data character signal is being received, said data character signal in uncompressed form corresponding to a data character signal encountered for the first time by said data compressor in said stream of data character signals, said apparatus further including, means for entering said data character signal received in uncompressed form into said storage means as a single character string, and means for outputting said data character signal received in uncompressed form.

20. The apparatus of claim 19 wherein said indication comprises a zero code.

21. Data decompression apparatus for receiving a stream of compressed code signals provided by a data compressor responsive to a stream of data character signals, said stream of data character signals including a repeating character string comprised of a repeating character, said data compressor being operative for compressing said repeating character string into two consecutive compressed code signals, said apparatus operative for recovering said stream of data character signals from said stream of compressed code signals, comprising storage means for storing strings of data character signals, each said string having a code signal associated therewith said strings being stored in said storage means in a linked tree structure, means for accessing said storage means with a current received compressed code signal for recovering a string from said storage means corresponding to said current received compressed code signal so as to recover the data character signals thereof, means for entering into said storage means, extended strings comprising a previously recovered string corresponding to a previously received compressed code signal extended by each data character signal, in turn, of said recovered string corresponding to said current received compressed code signal, means for assigning respective code signals to said extended strings, further means for entering into said storage means, further extended strings in response to receiving an unrecognized compressed code signal, said further extended strings comprising said previously recovered string corresponding to said previously received compressed code signal extended by each data character signal, in turn, of said previously recovered string, sequentially and repeatedly, until a string corresponding to said unrecognized compressed code signal is entered, means for assigning respective code signals to said further extended strings, means for providing the data character signals of said string corresponding to said unrecognized compressed code signal so as to recover said data character signals, said further means for entering being operative for entering into said storage means, additional extended strings comprising said string corresponding to said unrecognized compressed code signal further extended by the data character signals of said previously recovered string, in turn, until a number of said additional extended strings are entered into said storage means, said number being equal to the number of data character signals comprising said previously recovered string, and means for assigning respective code signals to said additional extended strings.

22. The apparatus of claim 21 wherein said previously received compressed code signal comprises a first of said consecutive compressed code signals and said unrecognized compressed code signal comprises a second of said consecutive compressed code signals, said previously recovered string comprises said repeating character and said string corresponding to said unrecognized compressed code signal comprises said repeating character string, said previously recovered string is stored on a path through said tree, and said means for entering and said further means for entering are operative for entering said further extended strings and said additional extended strings on said path.

23. Data decompression apparatus for receiving a stream of compressed code signals provided by a data compressor responsive to a stream of data character signals, said stream of data character signals including a repeating character group string comprised of a repeating character group, said data compressor being operative for compressing said repeating character group string into two consecutive compressed code signals, said apparatus operative for recovering said stream of data character signals from said stream of compressed code signals, comprising storage means for storing strings of data character signals, each said string having a code signal associated therewith, said strings being stored in said storage means in a linked tree structure, means for accessing said storage means with a current received compressed code signal for recovering a string from said storage means corresponding to said current received compressed code signal so as to recover the data character signals thereof, means for entering into said storage means, extended strings comprising a previously recovered string corresponding to a previously received compressed code signal extended by each data character signal, in turn, of said recovered string corresponding to said current received compressed code signal, means for assigning respective code signals to said extended strings, further means for entering into said storage means, further extended strings in response to receiving an unrecognized compressed code signal, said further extended strings comprising said previously recovered string corresponding to said previously received compressed code signal extended by each data character signal, in turn, of said previously recovered string, sequentially and repeatedly, until a string corresponding to said unrecognized compressed code signal is entered, means for assigning respective code signals to said further extended strings, means for providing the data character signals of sail string corresponding to said unrecognized compressed code signal so as to recover said data character signals, said further means for entering being operative for entering into said storage means, additional extended strings comprising said string corresponding to said unrecognized compressed code signal further extended by the data character signals of said previously recovered string, in turn, until a number of said additional extended strings are entered into said storage means, said number being equal to the number of data character signals comprising said previously recovered string, and means for assigning respective code signals to said additional extended strings.

24. The apparatus of claim 23 wherein said previously received compressed code signal comprises a first of said consecutive compressed code signals and said unrecognized compressed code signal comprises a second of said consecutive compressed code signals, said previously recovered string comprises said repeating character group and said string corresponding to said unrecognized compressed code signal comprises said repeating character group string, said previously recovered string is stored on a path through said tree, and said means for entering and said further means for entering are operative for entering said further extended strings and said additional extended strings on said path.

25. Data decompression apparatus for recovering a stream of data character signals from a stream of compressed code signals, comprising means for receiving said stream of compressed code signals, storage means for storing strings of data character signals, each said string having a code signal associated therewith, means for accessing said storage means with a current received compressed code signal for recovering a string from said storage means corresponding to said current received compressed code signal so as to recover the data character signals thereof, means for entering into said storage means, extended strings comprising a previously recovered string corresponding to a previously received compressed code signal extended by each data character signal, in turn, of said recovered string corresponding to said current received compressed code signal, further means for entering into said storage means, further extended strings in response to receiving an unrecognized compressed code signal, means for assigning respective code signals to said extended strings and to said further extended strings, said further means for entering being operative for generating said further extended strings in accordance with said previously recovered string, the number of data character signals comprising said previously recovered string, said unrecognized compressed code signal and said code signals being assigned to said further extended strings, one of said further extended strings being a string corresponding to said unrecognized compressed code signal, and means for providing the data character signals of said string corresponding to said unrecognized compressed code signal so as to recover said data character signals.

26. A data compression method for compressing a stream of data character signals into a stream of compressed code signals, comprising storing strings of data character signals in storage means, each said string having a code signal associated therewith, searching said stream of data character signals by comparing said stream to said stored strings to perform a character-by-character match therewith until a predetermined match is determined, providing the code signal associated with said predetermined match so as to provide said stream of compressed code signals, entering extended strings into said storage means, the entry of said extended strings being interleaved with the matching of the data character signals of said character-by-character match, an extended string PWC comprising a previously matched string P corresponding to a last provided code signal extended by a string WC, where W is a partial string in the process of being matched during said character-by-character match and C is a data character signal continuing the match of W during said character-by-character match, and assigning respective code signals to said extended strings.

27. The method of claim 26 wherein said entering step includes entering one of said extended strings into said storage means as each said data character signal is matched and before a next data character signal is matched.

28. The method of claim 27 wherein said predetermined match comprises the longest match between said stream of data character signals and said stored strings, said providing step comprises providing the code signal associated with said longest match so as to provide said stream of compressed code signals.

29. The method of claim 28 wherein said method operates in successive string matching cycles, respective longest matched strings being determined in said successive cycles, a current cycle following a previous cycle, said previously matched string being matched in said previous cycle with said last provided code signal being provided in said previous cycle, said character-by-character match occurring in said current cycle with said previously matched string being extended by said each data character signal during said current cycle.

30. A data compression method for compressing a stream of data character signals into a stream of compressed code signals, comprising storing strings of data character signals in storage means, each said string having a code signal associated therewith, searching said stream of data character signals by comparing said stream to said stored strings to perform a character-by-character match therewith until a predetermined match is determined, providing the code signal associated with said predetermined match so as to provide said stream of compressed code signals, entering into said storage means, interleaved with said character-by-character match, extended strings comprising a previously matched string corresponding to a last provided code signal extended by each data character signal, in turn, as each data character signal is matched, and assigning respective code signals to said extended strings, said method operating in successive string matching cycles, a current cycle following a previous cycle, said searching and said entering steps being performed so that when a partial string W and a data character signal C are matched, one of said extended strings is entered into said storage means with said data character signal C as an extension character of a string PW where P is said previously matched string and W is in the process of being matched in said current cycle.

31. The method of claim 29 wherein said searching step includes determining when said longest match has been achieved by determining when a data character signal fails to match during said character-by-character match, said searching step including beginning a next string matching cycle with said data character signal that failed to match.

32. The method of claim 26 further including initializing said storage means with all single character strings with respective codes associated therewith.

33. The method of claim 26 further including outputting a data character signal encountered for the first time in uncompressed form following an indication that such a data character signal is being output, and entering said data character signal encountered for the first time into said storage means as a single character string.

34. The method of claim 33 wherein said indication comprises a zero code.

35. A data compression method for compressing a stream of data character signals into a stream of compressed code signals, comprising storing strings of data character signals in storage means, each said string having a code signal associated therewith, searching said stream of data character signals by comparing said stream to said stored strings to perform a character-by-character match therewith until a predetermined match is determined, providing the code signal associated with said predetermined match so as to provide said stream of compressed code signals, entering into said storage means, interleaved with said character-by-character match, extended strings comprising a previously matched string corresponding to a last provided code signal extended by each data character signal, in turn, as each data character signal is matched, and assigning respective code signals to said extended strings, said storing step comprising storing said strings in said storage means in a linked tree structure, said stream of data character signals including a repeating character string comprised of a repeating character, said method compressing said repeating character string in two compressed code signals irrespective of the length thereof.

36. The method of claim 35 wherein said previously matched string comprises said repeating character, said searching step includes matching said repeating character string on a path through said tree, and said entering step includes entering said extended strings on said path, thereby compressing said repeating character string in two compressed code signals irrespective of the length thereof.

37. A data compression method for compressing a stream of data character signals into a stream of compressed code signals, comprising storing strings of data character signals in storage means, each said string having a code signal associated therewith, searching said stream of data character signals by comparing said stream to said stored strings to perform a character-by-character match therewith until a predetermined match is determined, providing the code signal associated with said predetermined match so as to provide said stream of compressed code signals, entering into said storage means, interleaved with said character-by-character match, extended strings comprising a previously matched string corresponding to a last provided code signal extended by each data character signal, in turn, as each data character signal is matched, and assigning respective code signals to said extended strings, said storing step comprising storing said strings in said storage means in a linked tree structure, said stream of data character signals including a repeating character group string comprised of a repeating character group, said method compressing said repeating character group string in two compressed code signals irrespective of the length thereof.

38. The method of claim 37 wherein said previously matched string comprises said repeating character group, said searching step includes matching said repeating character group string on a path through said tree, and said entering step includes entering said extended strings on said path, thereby compressing said repeating character group string in two compressed code signals irrespective of the length thereof.

39. A data decompression method for receiving a stream of compressed code signals provided by a data compressor responsive to a stream of data character signals, said method recovering said stream of data character signals from said stream of compressed code signals, comprising storing strings of data character signals in storage means, each said string having a code signal associated therewith, accessing said storage means with a current received compressed code signal for recovering a string from said storage means corresponding to said current received compressed code signal so as to recover the data character signals thereof, entering into said storage means, extended strings comprising a previously recovered string corresponding to a previously received compressed code signal extended by each data character signal, in turn, of said recovered string corresponding to said current received compressed code signal, assigning respective code signals to said extended strings, further entering into said storage means, further extended strings in response to receiving an unrecognized compressed code signal, said further extended strings comprising said previously recovered string corresponding to said previously received compressed code signal extended by each data character signal, in turn, of said previously recovered string, sequentially and repeatedly, until a string corresponding to said unrecognized compressed code signal is entered, assigning respective code signals to said further extended strings, and providing the data character signals of said string corresponding to said unrecognized compressed code signal so as to recover said data character signals.

40. The method of claim 39 wherein said further entering step includes entering into said storage means, additional extended strings comprising said string corresponding to said unrecognized compressed code signal further extended by the data character signals of said previously recovered string, in turn, until a number of said additional extended strings are entered into said storage means, said number being equal to the number of data character signals comprising said previously recovered string, assigning respective code signals to said additional extended strings.

41. The method of claim 40 wherein said method operates in successive string recovery cycles, respective strings being recovered in said successive cycles, a current cycle following a previous cycle, said previously recovered string being recovered in said previous cycle with said previously received compressed code signal being received in said previous cycle, said current received compressed code signal being received during said current cycle, and said entering step comprises entering said extended strings into said storage means during said current cycle.

42. The method of claim 41 wherein said unrecognized compressed code signal is received during said current cycle, said further entering step including entering said further extended strings and said additional extended strings into said storage means during said current cycle.

43. The method of claim 39 further including initializing said storage means with all single character strings with respective codes associated therewith.

44. The method of claim 39 wherein said stream of compressed code signals includes a data character signal in uncompressed form following an indication that such a data character signal is being received, said data character signal in uncompressed form corresponding to a data character signal encountered for the first time by said data compressor in said stream of data character signals, said method further including, entering said data character signal received in uncompressed form into said storage means as a single character string, and outputting said data character signal received in uncompressed form.

45. The method of claim 44 wherein said indication comprises a zero code.

46. A data decompression method for receiving a stream of compressed code signals provided by a data compressor responsive to a stream of data character signals, said stream of data character signals including a repeating character string comprised of a repeating character, said data compressor compressing said repeating character string into two consecutive compressed code signals, said method recovering said stream of data character signals from said stream of compressed code signals, comprising storing strings of data character signals in storage means, each said string having a code signal associated therewith, said storing step comprising storing said strings in said storage means in a linked tree structure, accessing said storage means with a current received compressed code signal for recovering a string from said storage means corresponding to said current received compressed code signal so as to recover the data character signals thereof, entering into said storage means, extended strings comprising a previously recovered string corresponding to a previously received compressed code signal extended by each data character signal, in turn, of said recovered string corresponding to said current received compressed code signal, assigning respective code signals to said extended strings, further entering into said storage means, further extended strings in response to receiving an unrecognized compressed code signal, said further extended strings comprising said previously recovered string corresponding to said previously received compressed code signal extended by each data character signal, in turn, of said previously recovered string, sequentially and repeatedly, until a string corresponding to said unrecognized compressed code signal is entered, assigning respective code signals to said further extended strings, providing the data character signals of said string corresponding to said unrecognized compressed code signal so as to recover said data character signals, said further entering step including entering into said storage means, additional extended strings comprising said string corresponding to said unrecognized compressed code signal further extended by the data character signals of said previously recovered string, in turn, until a number of said additional extended strings are entered into said storage means, said number being equal to the number of data character signals comprising said previously recovered string, and assigning respective code signals to said additional extended strings.

47. The method of claim 46 wherein said previously received compressed code signal comprises a first of said consecutive compressed code signals and said unrecognized compressed code signal comprises a second of said consecutive compressed code signals, said previously recovered string comprises said repeating character and said string corresponding to said unrecognized compressed code signal comprises said repeating character string, said previously recovered string is stored on a path through said tree, and said entering and said further entering steps include entering said further extended strings and said additional extended strings on said path.

48. A data decompression method for receiving a stream of compressed code signals provided by a data compressor responsive to a stream of data character signals, said stream of data character signals including a repeating character group string comprised of a repeating character group, said data compressor compressing said repeating character group string into two consecutive compressed code signals, said method recovering said stream of data character signals from said stream of compressed code signals, comprising storing strings of data character signals in storage means, each said string having a code signal associated therewith, said storing step comprising storing said strings in said storage means in a linked tree structure.

accessing said storage means with a current received compressed code signal for recovering a string from said storage means corresponding to said current received compressed code signal so as to recover the data character signals thereof, entering into said storage means, extended strings comprising a previously recovered string corresponding to a previously received compressed code signal extended by each data character signal, in turn, of said recovered string corresponding to said current received compressed code signal, assigning respective code signals to said extended strings, further entering into said storage means, further extended strings in response to receiving an unrecognized compressed code signal, said further extended strings comprising said previously recovered string corresponding to said previously received compressed code signal extended by each data character signal, in turn, of said previously recovered string, sequentially and repeatedly, until a string corresponding to said unrecognized compressed code signal is entered, assigning respective code signals to said further extended strings, providing the data character signals of said string corresponding to said unrecognized compressed code signal so as to recover said data character signals, said further entering step including entering into said storage means, additional extended strings comprising said string corresponding to said unrecognized compressed code signal further extended by the data character signals of said previously recovered string, in turn, until a number of said additional extended strings are entered into said storage means, said number being equal to the number of data character signals comprising said previously recovered string, and assigning respective code signals to said additional extended strings.

49. The method of claim 48 wherein said previously received compressed code signal comprises a first of said consecutive compressed code signals and said unrecognized compressed code signal comprises a second of said consecutive compressed code signals, said previously recovered string comprises said repeating character group and said string corresponding to said unrecognized compressed code signal comprises said repeating character group string, said previously recovered string is stored on a path through said tree, and said entering and said further entering steps include entering said further extended strings and said additional extended strings on said path.

50. A data decompression method for recovering a stream of data character signals from a stream of compressed code signals, comprising receiving said stream of compressed code signals, storing strings of data character signals in storage means, each said string having a code signal associated therewith, accessing said storage means with a current received compressed code signal for recovering a string from said storage means corresponding to said current received compressed code signal so as to recover the data character signals thereof, entering into said storage means, extended strings comprising a previously recovered string corresponding to a previously received compressed code signal extended by each data character signal, in turn, of said recovered string corresponding to said current received compressed code signal, further entering into said storage means, further extended strings in response to receiving an unrecognized compressed code signal, assigning respective code signals to said extended strings and to said further extended strings, said further entering step includes generating said further extended strings in accordance with said previously recovered string, the number of data character signals comprising said previously recovered string, said unrecognized compressed code signal and said code signals being assigned to said further extended strings, one of said further extended strings being a string corresponding to said unrecognized compressed code signal, and providing the data character signals of said string corresponding to said unrecognized compressed code signal so as to recover said data character signals.

* * * * *